(12) United States Patent
Yamazaki

(10) Patent No.: US 9,012,993 B2
(45) Date of Patent: Apr. 21, 2015

(54) SEMICONDUCTOR DEVICE

(75) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 325 days.

(21) Appl. No.: 13/549,864

(22) Filed: Jul. 16, 2012

(65) Prior Publication Data

US 2013/0020570 A1    Jan. 24, 2013

(30) Foreign Application Priority Data

Jul. 22, 2011    (JP) .................................. 2011-161329

(51) Int. Cl.
| | | |
|---|---|---|
| H01L 29/786 | (2006.01) | |
| H01L 29/417 | (2006.01) | |
| H01L 27/02 | (2006.01) | |
| H01L 27/07 | (2006.01) | |
| H01L 27/108 | (2006.01) | |
| H01L 27/115 | (2006.01) | |

(Continued)

(52) U.S. Cl.
CPC ...... *H01L 29/41733* (2013.01); *H01L 27/0207* (2013.01); *H01L 27/0733* (2013.01); *H01L 29/78618* (2013.01); *H01L 27/1085* (2013.01); *H01L 27/10873* (2013.01); *H01L 27/1156* (2013.01); *H01L 27/1225* (2013.01); *H01L 28/60* (2013.01); *G11C 11/404* (2013.01)

(58) Field of Classification Search
USPC ............................................. 257/300, 347
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZNO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Eugene Lee
(74) *Attorney, Agent, or Firm* — Eric J. Robinson; Robinson Intellectual Property Law Office, P.C.

(57) ABSTRACT

An object of the present invention is to provide a semiconductor device in which stored data can be held even when power is not supplied for a certain time. Another object is to increase the degree of integration of a semiconductor device and to increase the storage capacity per unit area. A semiconductor device is formed with a material capable of sufficiently reducing off-state current of a transistor, such as an oxide semiconductor material that is a wide-bandgap semiconductor. With the use of a semiconductor material capable of sufficiently reducing off-state current of a transistor, the semiconductor device can hold data for a long time. Furthermore, a wiring layer provided under a transistor, a high-resistance region in an oxide semiconductor film, and a source electrode are used to form a capacitor, thereby reducing the area occupied by the transistor and the capacitor.

15 Claims, 11 Drawing Sheets

(51) Int. Cl.
*H01L 27/12* (2006.01)
*H01L 49/02* (2006.01)
*G11C 11/404* (2006.01)

(56) References Cited

U.S. PATENT DOCUMENTS

| | | | |
|---|---|---|---|
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,004,871 B2 * | 8/2011 | Kaneko et al. | 365/145 |
| 8,378,341 B2 * | 2/2013 | Hayashi et al. | 257/43 |
| 8,759,206 B2 * | 6/2014 | Kimura | 438/551 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0216877 A1 | 9/2006 | Toyota et al. | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/1027292 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0027371 A1 | 1/2009 | Lin et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0184315 A1 | 7/2009 | Lee et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0156027 A1 | 6/2011 | Yamazaki et al. | |
| 2012/0097942 A1 | 4/2012 | Imoto et al. | |

FOREIGN PATENT DOCUMENTS

| | | |
|---|---|---|
| JP | 53-053277 | 5/1978 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

(56) References Cited

OTHER PUBLICATIONS

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the In2O3-Ga2ZnO4-ZnO system at 1350°C,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m =7,8,9 and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N. et al., "Crystallization and Reduction of Sol-Gel-Derived Zinc Oxide Films by Irradiation with Ultraviolet Lamp, ", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Fiat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition: The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-IN. AMOLED Display With Driver Circuit Using Amorphous IN-GA-ZN-Oxide TFTS,", IDW '09 : Proceedings of the 16th International Display Workshops, 2009, 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZNO TFT,", IMID '07 Digest, 2007, pp. 1249-1252.

Godo.H et al., "Temperature Dependence of Characteristics and Electronic Structure for Amorphous IN-GA-ZN-Oxide TFT,", AM-FPD '09 Digest of Technical Papers, Jul. 1, 2009, pp. 41-44.

Osada.T et al., "Development of Driver-Integrated Panel Using Amorphous IN-GA-ZN-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZNO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous IN-GA-ZN-Oxide TFT,", SID Digest '09 : SID International Symposium Digest of Technical Papers, May 31, 2009, pp. 1110-1112.

Ohara.H et al., "21.3:4.0 IN. QVGA AMOLED Display Using IN-GA-ZN-Oxide TFTS with a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, Vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

(56) References Cited

OTHER PUBLICATIONS

Lee.H et al., "Current Status of, Challenges to, and Perspective View of AM-OLED ,", IDW '06 : Proceedings of the 13th International Display Workshops, Dec. 7, 2006, pp. 663-666.

Kikuchi. H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YBFE2O4, and YB2FE3O7 Types of Structures for Compounds in the IN2O3 and SC2O3-A2O3-BO Systems [A; FE, GA, or AL; B: MG, MN, FE, NI, CU,or ZN] at Temperatures over 1000°C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review.A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", JPN. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids). 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214TH ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZNO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

SEMICONDUCTOR DEVICE

BACKGROUND OF THE INVENTION

1. Field of the Invention

The disclosed invention relates to a semiconductor device including an oxide semiconductor.

2. Description of the Related Art

Memory devices including semiconductor elements are broadly classified into two categories: a volatile memory device that loses stored data when power supply is stopped, and a non-volatile memory device that holds stored data even when power is not supplied.

A typical example of a volatile memory device is a DRAM (dynamic random access memory). A DRAM stores data in such a manner that a transistor included in a memory element is selected and charge is stored in a capacitor (e.g., see Patent Document 1).

When data is read from a DRAM, charge in a capacitor is lost on the above-described principle; thus, another writing operation is necessary whenever data is read out. Moreover, charge flows into or out of a capacitor even when a transistor included in a memory element is not selected, due to leakage current between a source and a drain in an off state (off-state current) or the like; therefore, the data storing time is short. For that reason, another writing operation (refresh operation) is necessary at predetermined intervals, and it is difficult to reduce power consumption sufficiently. Furthermore, since stored data is lost when power supply stops, an additional memory device using a magnetic material or an optical material is needed in order to store the data for a long time.

Another example of a volatile memory device is an SRAM (static random access memory). An SRAM holds stored data by using a circuit such as a flip-flop and thus does not need refresh operation. This means that an SRAM has an advantage over a DRAM. However, cost per storage capacity is increased because a circuit such as a flip-flop is used. Moreover, as in a DRAM, stored data in an SRAM is lost when power supply stops.

A structure in which an oxide semiconductor containing indium (In), gallium (Ga), and zinc (Zn) is provided for an active layer of a transistor included in a DRAM has been disclosed (e.g., see Patent Document 2).

REFERENCE

Patent Document

[Patent Document 1] Japanese Published Patent Application No. S53-53277
[Patent Document 2] United States Patent Application Publication No. 2011/0156027

SUMMARY OF THE INVENTION

In view of the foregoing problems, an object of one embodiment of the disclosed invention is to provide a semiconductor device in which stored data can be held even when power is not supplied for a certain time.

Another object of one embodiment of the disclosed invention is to increase the degree of integration of a semiconductor device and to increase storage capacity per unit area.

In the disclosed invention, a semiconductor device is formed with a material capable of sufficiently reducing off-state current of a transistor, such as an oxide semiconductor material that is a wide-bandgap semiconductor. With the use of a semiconductor material capable of sufficiently reducing off-state current of a transistor, data can be held for a long time. Furthermore, in the disclosed invention, a wiring layer provided under a transistor, a high-resistance region in an oxide semiconductor film, and a source electrode are used to form a capacitor, thereby reducing the area occupied by the transistor and the capacitor.

One embodiment of the disclosed invention is a semiconductor device including a transistor and a capacitor. The transistor includes an oxide semiconductor film; a source electrode layer and a drain electrode layer provided over and in contact with the oxide semiconductor film; a gate electrode layer provided over and overlapping with the oxide semiconductor film; and a gate insulating film provided between the oxide semiconductor film and the gate electrode layer. The oxide semiconductor film includes a channel formation region formed in a region overlapping with the gate electrode layer; a source region and a drain region formed in a superficial portion of the oxide semiconductor film so that the channel formation region is sandwiched between the source region and the drain region; a high-resistance region overlapping with and in contact with the source region and the drain region. The source region and the drain region have a lower resistance than the channel formation region and include a metal element. The high-resistance region has a higher resistance than the source region and the drain region. The source electrode layer is in contact with the source region of the oxide semiconductor film. The drain electrode layer is in contact with the drain region of the oxide semiconductor film. The capacitor comprises a wiring layer provided under the oxide semiconductor film and overlapping with the high-resistance region; the high-resistance region; and the source electrode layer.

In the above semiconductor device, a low-resistance region including a dopant may be provided between the channel formation region and the source region and between the channel formation region and the drain region. Furthermore, phosphorus or boron is preferably used as the dopant.

In the above semiconductor device, a sidewall insulating film is preferably provided to be in contact with a side surface of the gate electrode layer.

In the above semiconductor device, the oxide semiconductor film may be formed over and to be in contact with an insulating film, and the wiring layer may be embedded in the insulating film.

In the above semiconductor device, the oxide semiconductor film preferably includes indium, zinc, and at least one selected from rare earth elements. Alternatively, in the above semiconductor device, the oxide semiconductor film preferably includes indium, zinc, and at least one selected from zirconium, gadolinium, cerium, and titanium.

In the above semiconductor device, aluminum or magnesium is preferably used as the metal element.

In this specification and the like, the term "channel length direction" means a direction from a source region (or a source electrode) toward a drain region (or a drain electrode) or the opposite direction, along the shortest path between the source region and the drain region. Further, in this specification and the like, the term "channel width direction" means a direction substantially perpendicular to the channel length direction.

In this specification and the like, the term such as "over" or "below" does not necessarily mean that a component is placed "directly on" or "directly under" another component. For example, the expression "a gate electrode over a gate insulating layer" can mean the case where there is an additional component between the gate insulating layer and the gate electrode.

In this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" is formed in an integrated manner.

Functions of a "source" and a "drain" might interchange when a transistor of opposite polarity is used or the direction of current flow is changed in circuit operation, for example. Therefore, the terms "source" and "drain" can be replaced with each other in this specification and the like.

In this specification and the like, the expression "electrically connected" includes the case where components are connected through an object having any electric function. There is no particular limitation on an object having any electric function as long as electric signals can be transmitted and received between components that are connected through the object. Examples of an "object having any electric function" include an electrode, a wiring, a switching element such as a transistor, a resistor, an inductor, a capacitor, and an element with a variety of functions.

In one embodiment of the disclosed invention, a semiconductor device is manufactured with a material capable of sufficiently reducing the off-state current of a transistor, such as an oxide semiconductor material that is a wide-bandgap semiconductor. Owing to the semiconductor material capable of sufficiently reducing the off-state current of a transistor, stored data can be held for an extremely long time. In other words, power consumption can be sufficiently reduced because refresh operation becomes unnecessary or the frequency of refresh operation can be extremely low. Moreover, stored data can be held for a long time even when power is not supplied for a certain time (note that the potential is preferably fixed).

In the disclosed invention, a wiring layer provided under a transistor, a high-resistance region in an oxide semiconductor film, and a source electrode are used to form a capacitor. Therefore, the area occupied by a transistor and a capacitor can be reduced, whereby the degree of integration of a semiconductor device can be enhanced and the storage capacity per unit area can be increased.

DETAILED DESCRIPTION OF THE INVENTION

Figure 1A:
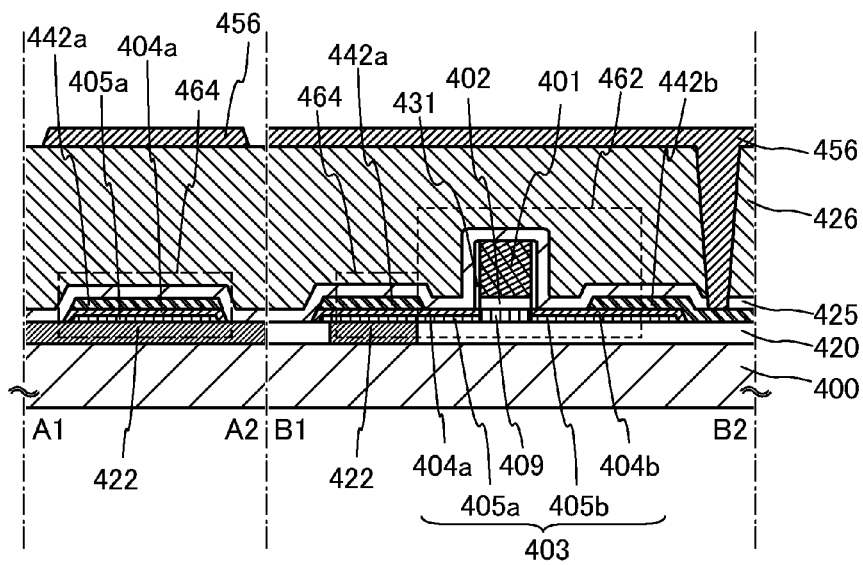
FIGS. 1A to 1C are a cross-sectional view, a plan view, and a circuit diagram of a semiconductor device according to one embodiment of the present invention.

Hereinafter, embodiments of the present invention will be described with reference to the drawings. Note that the present invention is not limited to the following description and it will be readily appreciated by those skilled in the art that modes and details can be modified in various ways without departing from the spirit and the scope of the present invention. Therefore, the present invention should not be construed as being limited to the description in the following embodiments.

Note that the position, size, range, or the like of each structure illustrated in the drawings and the like is not accurately represented in some cases for easy understanding. Therefore, the disclosed invention is not necessarily limited to the position, size, range, or the like as disclosed in the drawings and the like.

In this specification and the like, ordinal numbers such as "first", "second", and "third" are used in order to avoid confusion among components, and the terms do not limit the components numerically.

(Embodiment 1)

In this embodiment, the structure of a semiconductor device according to one embodiment of the present invention is described with reference to FIGS. 1A to 1C and FIGS. 2A to 2C.

<Cross-Sectional Structure and Plan View of Semiconductor Device>

Figure 1B:
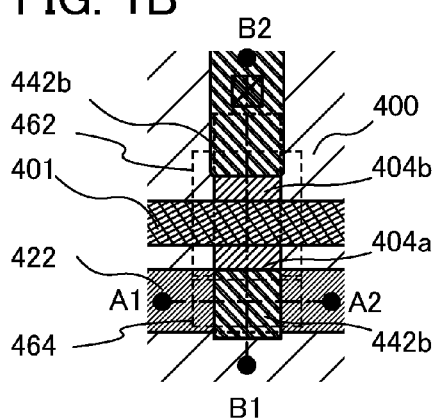
Figure 1C:
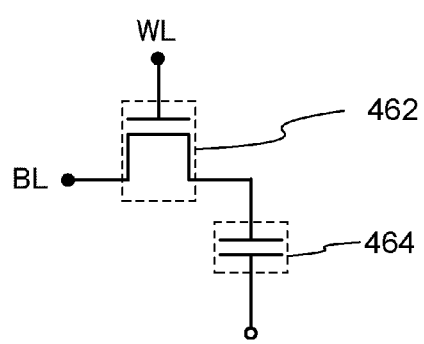

FIGS. 1A to 1C illustrate an example of a structure of a semiconductor device. FIG. 1A is a cross-sectional view of the semiconductor device. FIG. 1B is a plan view of the semiconductor device. In FIG. 1A, A1-A2 is a cross section perpendicular to a channel length direction of a transistor, and B1-B2 is a cross section parallel to the channel length direction of the transistor. The semiconductor device illustrated in FIGS. 1A and 1B includes a transistor 462 and a capacitor 464, which include an oxide semiconductor.

Note that either an n-channel transistor or a p-channel transistor can be used as the transistor 462. Here, the case where the transistor 462 is an n-channel transistor is described.

The transistor 462 includes an oxide semiconductor film 403 provided over a substrate 400 with an insulating film 420 provided therebetween, a source electrode layer (or a drain electrode layer) 442a and a drain electrode layer (or a source electrode layer) 442b provided in contact with the oxide semiconductor film 403, a gate electrode layer 401 overlapping with the oxide semiconductor film 403, and a gate insulating film 402 provided between the oxide semiconductor film 403 and the gate electrode layer 401. Here, the oxide semiconductor film 403 includes a channel formation region 409, a source region 404a, a drain region 404b, a high-resistance region 405a, and a high-resistance region 405b. The channel formation region 409 is formed in a region overlapping with the gate electrode layer 401. The source region 404a and the drain region 404b are formed in a superficial portion of the oxide semiconductor film 403 so that the channel formation region 409 is sandwiched between the source region 404a and the drain region 404b. The source region 404a and the drain region 404b have a higher resistance than the channel formation region 409 and contain a metal element. The high-resistance region 405a and the high-resistance region 405b are provided to overlap with the source region 404a and the drain region 404b and have a higher resistance than the source region 404a and the drain region 404b. The source electrode layer 442a is in contact with a source region 404a of the oxide semiconductor film 403, and the drain electrode layer 442b is in contact with a drain region 404b of the oxide semiconductor film 403. Furthermore, a sidewall insulating film 431 may be provided to be in contact with a side surface of the gate electrode layer 401.

An oxide semiconductor used for the oxide semiconductor film 403 preferably contains at least indium (In) or zinc (Zn). In particular, In and Zn are preferably contained. In addition to these, one or more selected from rare earth elements (scandium (Sc), yttrium (Y), and lanthanoid) are preferably contained as a stabilizer for reducing variation in electric characteristics of a transistor including the oxide semiconductor. It is more preferable that one or more selected from cerium (Ce), neodymium (Nd), and gadolinium (Gd)), which are lanthanoid elements, be contained as the stabilizer. Alternatively, instead of the rare earth elements, one or more selected from zirconium (Zr) and titanium (Ti) may be contained as the stabilizer. With the use of the above-mentioned materials for the oxide semiconductor film 403, in a transistor including the oxide semiconductor film, the amount of variation in initial electric characteristics is very small, the ratio between on-state current and off-state current increases, the off-state current decreases, and hysteresis is also suppressed.

Since the oxide semiconductor film 403 formed with such materials can be a wide-bandgap semiconductor material which has a large energy gap (e.g., 2.8 eV or higher), the off-state current of the transistor 462 including the oxide semiconductor film 403 can be sufficiently small.

Here, it is preferable that the oxide semiconductor film 403 used for the transistor 462 be highly purified by sufficiently removing an impurity such as hydrogen therefrom and then sufficiently supplying oxygen thereto. Specifically, the hydrogen concentration in the oxide semiconductor film 403 is $5\times10^{19}$ atoms/cm$^3$ or less, preferably $5\times10^{18}$ atoms/cm$^3$ or less, more preferably $5\times10^{17}$ atoms/cm$^3$ or less. Note that the hydrogen concentration in the oxide semiconductor film 403 is measured by secondary ion mass spectrometry (SIMS). In the oxide semiconductor film 403 which is highly purified by sufficiently reducing the hydrogen concentration and in which defect levels in an energy gap due to oxygen deficiency are reduced by supplying a sufficient amount of oxygen, the carrier concentration is less than $1\times10^{12}$/cm$^3$, preferably less than $1\times10^{11}$/cm$^3$, more preferably less than $1.45\times10^{10}$/cm$^3$. For example, the off-state current (per unit channel width (1 μm), here) at room temperature (25° C.) is 100 zA (1 zA (zeptoampere) is $1\times10^{-21}$ A) or less, preferably 10 zA or less, more preferably 1 zA or less, still more preferably 100 yA or less. In this manner, with the use of an i-type (intrinsic) or substantially i-type oxide semiconductor film 403, the transistor 462 having extremely favorable off-state current characteristics can be obtained.

Note that the oxide semiconductor film 403 is a non-single-crystal oxide semiconductor film, and may be amorphous or may have crystallinity. For example, as the oxide semiconductor film 403 having crystallinity, a CAAC-OS (c-axis aligned crystalline oxide semiconductor) film including crystals c-axes of which are substantially perpendicular to the surface can be used.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor layer is higher than that in the vicinity of the surface where the oxide semiconductor layer is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

Note that nitrogen may be substituted for part of oxygen included in the oxide semiconductor film.

In an oxide semiconductor having a crystal part such as the CAAC-OS, defects in the bulk can be further reduced and when the surface flatness of the oxide semiconductor is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness ($R_a$) of less than or equal to 1 nm, preferably less than or equal to 0.3 nm, more preferably less than or equal to 0.1 nm.

When a CAAC-OS film is used as the oxide semiconductor film 403, an improvement in carrier-transport properties (e.g., mobility) is expected and structure stabilization is achieved, which can result in an improvement in characteristics and reliability of an element including the oxide semiconductor film 403.

With use of the CAAC-OS film in a transistor, change in electric characteristics of the transistor due to irradiation with visible light or ultraviolet light can be reduced. Accordingly, the transistor has high reliability.

In the oxide semiconductor film 403 described above, a metal element is added to superficial portions in the regions between which the channel formation region 409 overlapping with the gate electrode layer 401 is sandwiched, so that the source region 404a and the drain region 404b are formed. Since the metal element is added to the source region 404a and the drain region 404b, the source region 404a and the drain region 404b have lower resistance than the channel formation region 409. In the oxide semiconductor film 403, regions to which the metal element is not added and which overlap with the source region 404a and the drain region 404b are referred to as high-resistance region 405a and high-resistance region 405b. The high-resistance region 405a and high-resistance region 405b have higher resistance than the source region 404a and the drain region 404b. Note that in this specification, the term "superficial portion" means a portion of the oxide semiconductor film from the surface to a depth corresponding to approximately 1% to 50% of the thickness of the oxide semiconductor film.

As the metal element added to the source region 404a and the drain region 404b, one or more selected from aluminum (Al), titanium (Ti), molybdenum (Mo), tungsten (W), hafnium (Hf), tantalum (Ta), lanthanum (La), barium (Ba), magnesium (Mg), zirconium (Zr), and nickel (Ni) can be used.

By provision of the source region 404a and the drain region 404b which contain a metal element and have lower resistance than the channel formation region 409 in the oxide semiconductor film 403 of the transistor 462, the transistor 462 can have excellent on-state characteristics (e.g., on-state current and field effect mobility), leading to high-speed operation and quick response. Furthermore, by electrically connecting the oxide semiconductor film 403 to the source electrode layer 442a and the drain electrode layer 442b in the source region 404a and the drain region 404b, contact resistance between the oxide semiconductor film 403 and the source electrode layer 442a and between the oxide semiconductor film 403 and the drain electrode layer 442b can be lowered.

The source electrode layer 442a, the high-resistance region 405a, and a wiring layer 422 under the oxide semiconductor film 403 and overlapping with the high-resistance region 405a overlap with one another, whereby the capacitor 464 is formed. Here, the oxide semiconductor film 403 is a wide-bandgap semiconductor material as described above, and the high-resistance region 405a can serve as a dielectric substance of the capacitor 464 because of its sufficiently high resistance. In other words, the capacitor 464 is a capacitor in which the source electrode layer 442a serves as one electrode, the high-resistance region 405a serves as a dielectric substance of the capacitor, and the wiring layer 422 serves as the other electrode. With such a structure, the capacitor 464 can have sufficient capacitance. In addition, since the high-resistance region 405a can be used as a dielectric substance of the capacitor, there is no necessity to provide an additional insulating film as the dielectric substance; accordingly, the process for manufacturing the semiconductor device can be simplified. Therefore, an improvement in yield of the manufacturing process and a reduction in manufacturing cost can be expected.

By the formation of the capacitor 464 in which the source electrode layer 442a of the transistor 462 and the oxide semiconductor film 403 of the transistor 462 overlap with each other, the area occupied by the semiconductor device can be reduced. When a memory device in which the semiconductor devices in this embodiment are arrayed as memory cells is manufactured, the effect of reduction in area can be obtained in accordance with the number of memory cells. Thus, the memory device can be highly integrated effectively, and the storage capacity per unit area can be increased.

Even when a wide-bandgap oxide semiconductor is used as the oxide semiconductor film 403 and the high-resistance region 405a has a sufficiently high resistance, a metal element is added to form the source region 404a and the drain region 404b, whereby the transistor 462 can have excellent on-state characteristics.

Note that in the semiconductor device in FIG. 1A, the wiring layer 422 is formed to be embedded in the insulating film 420 in contact with the oxide semiconductor film 403, be exposed at the top surface, and be in contact with the high-resistance region 405a; however, the structure is not limited thereto. For example, a structure in which the wiring layer 422 is not exposed at the top surface of the insulating film 420, and the high-resistance region 405a and the insulating film 420 which overlap with each other are used as the dielectric substance of the capacitor 464 may be employed.

An insulating film 425 and an insulating film 426 are provided over the transistor 462 and the capacitor 464. A wiring layer 456 is formed over the insulating film 425 and the insulating film 426 to be electrically connected to the drain electrode layer 442b through openings formed in the insulating films 425 and 426 and the like. Here, the wiring layer 456 is preferably provided to overlap with at least part of the oxide semiconductor film 403 of the transistor 462. In addition, an insulating layer may be provided over the wiring layer 456.

<Circuit Configuration of Semiconductor Device>

Next, circuit configuration and operation of the semiconductor device illustrated in FIGS. 1A and 1B are described with reference to FIG. 1C.

In the semiconductor device illustrated in FIG. 1C, a bit line BL is electrically connected to a drain electrode of the transistor 462, a word line WL is electrically connected to a gate electrode of the transistor 462, and a source electrode of the transistor 462 is electrically connected to a first terminal of the capacitor 464. A predetermined potential (e.g., ground potential) is applied to a second terminal of the capacitor 464.

Here, the bit line BL corresponds to the wiring layer 456 in FIG. 1A, the word line WL corresponds to the gate electrode layer 401 in FIG. 1A or a wiring electrically connected to the gate electrode layer 401, the first terminal of the capacitor 464 corresponds to the source electrode layer 442a, and the second terminal of the capacitor 464 corresponds to the wiring layer 422.

Here, the transistor 462 is a transistor including the oxide semiconductor film 403 which is a wide-bandgap semiconductor material as described above. The transistor including the oxide semiconductor film 403 has a feature of significantly small off-state current. For that reason, a potential of the first terminal of the capacitor 464 (or a charge accumulated in the capacitor 464) can be held for an extremely long time by turning off the transistor 462. Thus, the semiconductor device illustrated in FIGS. 1A to 1C serves as a memory element and is referred to as memory cell below. The memory cells are arrayed to form a memory cell array, whereby a memory device can be formed.

Next, writing and holding of data in the semiconductor device (memory cell) illustrated in FIG. 1C are described.

First, the potential of the word line WL is set to a potential at which the transistor 462 is turned on, so that the transistor 462 is turned on. Thus, the potential of the bit line BL is supplied to the first terminal of the capacitor 464 (writing). After that, the potential of the word line WL is set to a potential at which the transistor 462 is turned off, so that the transistor 462 is turned off. Thus, the potential of the first terminal of the capacitor 464 is held (holding).

Since the off-state current of the transistor 462 is extremely small, the potential of the first terminal of the capacitor 464 (or the charge accumulated in the capacitor) can be held for a long time.

Next, reading of data is described. When the transistor 462 is turned on, the bit line BL which is in a floating state and the capacitor 464 are electrically connected to each other, and the charge is redistributed between the bit line BL and the capacitor 464. As a result, the potential of the bit line BL is changed. The amount of change in potential of the bit line BL varies depending on the potential of the first terminal of the capacitor 464 (or the charge accumulated in the capacitor 464).

For example, the potential of the bit line BL after charge redistribution is $(C_B \times V_{B0} + C \times V)/(C_B + C)$, where V is the potential of the first terminal of the capacitor 464, C is the capacitance of the capacitor 464, $C_B$ is the capacitance of the bit line BL (hereinafter also referred to as bit line capacitance), and $V_{B0}$ is the potential of the bit line BL before the charge redistribution. Therefore, it can be found that assuming that the memory cell is in either of two states in which the potentials of the first terminal of the capacitor 464 are $V_1$ and $V_0$ ($V_1 > V_0$), the potential of the bit line BL in the case of holding the potential $V_1$ ($=(C_B \times V_{B0} + C \times V_1)/(C_B + C)$) is higher than the potential of the bit line BL in the case of holding the potential $V_0$ ($=(C_B \times V_{B0} + C \times V_0)/(C_B + C)$).

Then, by comparing the potential of the bit line BL with a predetermined potential, data can be read.

As described above, the semiconductor device illustrated in FIG. 1C can hold charge that is accumulated in the capacitor 464 for a long time because the off-state current of the transistor 462 is extremely small. In other words, power consumption can be sufficiently reduced because refresh operation becomes unnecessary or the frequency of refresh operation can be extremely low. Moreover, stored data can be held for a long time even when power is not supplied for a certain time.

Note that in the above description, an n-type transistor (an n-channel transistor) using electrons as carriers is used; however, a p-channel transistor using holes as carriers can be used instead of an n-channel transistor.

Figure 2A:
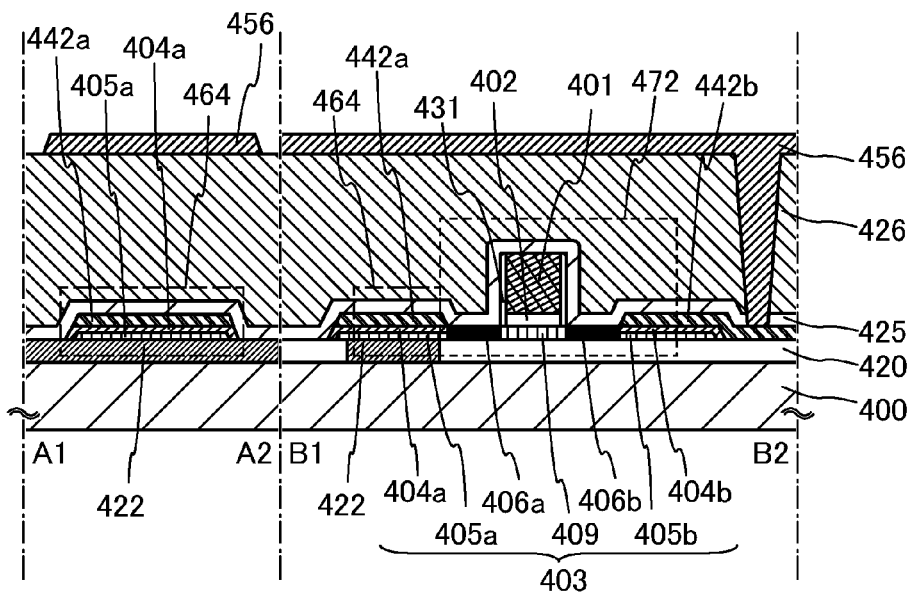
FIGS. 2A to 2C are a cross-sectional view, a plan view, and a circuit diagram of a semiconductor device according to one embodiment of the present invention.
Figure 2B:
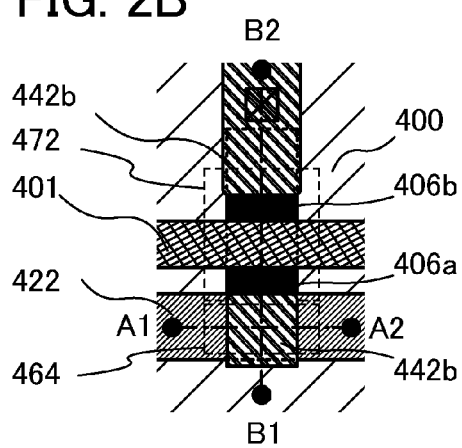
Figure 2C:
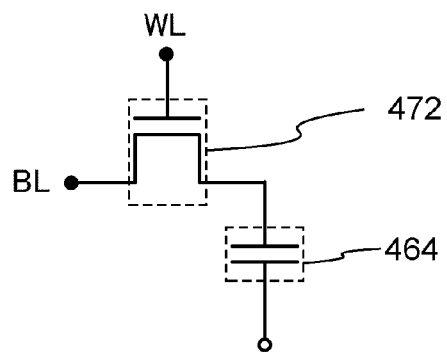

FIGS. 2A to 2C illustrate a semiconductor device which differs from the semiconductor device in FIGS. 1A to 1C. FIG. 2A is a cross-sectional view of the semiconductor device. FIG. 2B is a plan view of the semiconductor device. FIG. 2C illustrates a circuit configuration of the semiconductor device. In FIG. 2A, A1-A2 is a cross section perpendicular to a channel length direction of a transistor, and B1-B2 is a cross section parallel to the channel length direction of the transistor. The semiconductor device illustrated in FIGS. 2A to 2C includes a transistor 472 and the capacitor 464 each including an oxide semiconductor.

The semiconductor device in FIGS. 2A to 2C includes the transistor 472 which differs from the transistor 462 included in the semiconductor device in FIGS. 1A to 1C. The transistor 472 differs from the transistor 462 in that a low-resistance region 406a containing a dopant is formed between the source region 404a and the channel formation region 409, and a low-resistance region 406b containing a dopant is formed between the drain region 404b and the channel formation region 409. Here, the low-resistance region 406a and the low-resistance region 406b each have a lower resistance than the channel formation region 409. Note that the structure of the transistor 472 is the same as that of the transistor 462 except the above point, and the structure of the semiconductor device in FIGS. 2A to 2C other than the transistor 472 is the same as the structure of the semiconductor device in FIGS. 1A to 1C. Accordingly, the description of FIGS. 1A to 1C can be referred to for details.

Here, the dopant is an impurity by which the electrical conductivity of the oxide semiconductor film 403 is changed. One or more selected from the following can be used as a dopant 421: Group 15 elements (typical examples thereof are phosphorus (P), arsenic (As), and antimony (Sb)), boron (B), aluminum (Al), nitrogen (N), argon (Ar), helium (He), neon (Ne), indium (In), fluorine (F), chlorine (Cl), titanium (Ti), and zinc (Zn).

By provision of the low-resistance region 406a and the low-resistance region 406b in this manner, the on-state characteristics (e.g., on-state current and field effect mobility) of the transistor 472 can be further improved.

As described above, the off-state current of a transistor including an oxide semiconductor that is a wide-bandgap semiconductor is sufficiently small; therefore, the semiconductor device including the transistor in this embodiment can hold data for an extremely long time. In other words, power consumption can be sufficiently reduced because refresh operation becomes unnecessary or the frequency of refresh operation can be extremely low. Moreover, stored data can be held for a long time even when power is not supplied for a certain time (note that the potential is preferably fixed).

Furthermore, in the semiconductor device in this embodiment, a wiring layer provided under a transistor, a high-resistance region in an oxide semiconductor film, and a source electrode are used to form a capacitor. Therefore, the area occupied by a transistor and a capacitor can be reduced, whereby the degree of integration of a semiconductor device can be enhanced and the storage capacity per unit area can be increased.

The structures and methods described in this embodiment can be combined as appropriate with any of the structures and methods described in the other embodiments.

(Embodiment 2)

In this embodiment, a method for manufacturing the semiconductor device in Embodiment 1 is described with reference to FIGS. 3A to 3D, FIG. 4A to 4C, FIGS. 5A and 5B, and FIGS. 6A and 6B.

Description is given below of a process for manufacturing the semiconductor device including the transistor 462 and the capacitor 464 in FIGS. 1A to 1C, with reference to FIGS. 3A to 3D, FIGS. 4A to 4C, and FIGS. 5A and 5B.

Figure 3A:
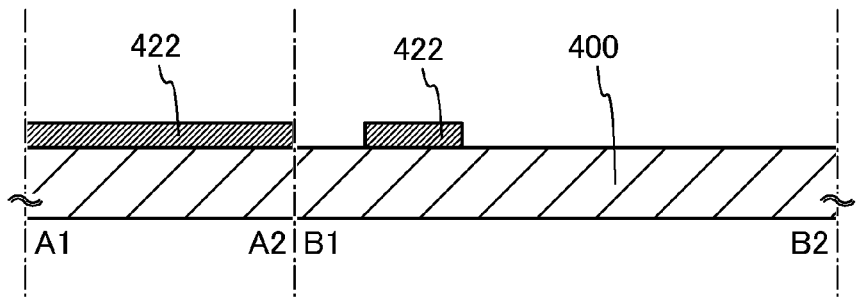
FIGS. 3A to 3D are cross-sectional views illustrating manufacturing steps of a semiconductor device according to one embodiment of the present invention.

First, a layer including a conductive material is formed over the substrate 400 having an insulating surface, and the layer including a conductive material is selectively etched to form the wiring layer 422 (see FIG. 3A).

There is no particular limitation on a substrate that can be used as the substrate 400 having an insulating surface as long as it has heat resistance high enough to withstand heat treatment performed later. For example, a glass substrate of barium borosilicate glass, aluminoborosilicate glass, or the like, a ceramic substrate, a quartz substrate, or a sapphire substrate can be used. A single-crystal semiconductor substrate or a polycrystalline semiconductor substrate of silicon, silicon carbide, or the like; a compound semiconductor substrate of silicon germanium or the like; an SOI substrate; or the like can be used as the substrate 400, or the substrate provided with a semiconductor element can be used as the substrate 400.

The layer including a conductive material can be formed with the use of a metal material such as molybdenum, titanium, tantalum, tungsten, aluminum, copper, neodymium, or scandium, or an alloy material containing any of these materials as its main component. The layer including a conductive material may have a single-layer structure or a stacked-layer structure. There is no particular limitation on the method for forming the layer including a conductive material, and a variety of film formation methods such as an evaporation method, a CVD method, a sputtering method, or a spin coating method can be employed. Note that this embodiment shows an example of the case where the layer including a conductive material is formed with the use of a metal material.

Figure 3B:
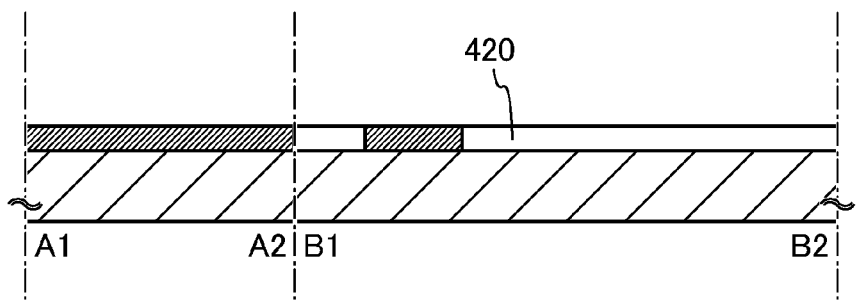

Next, the insulating film 420 is formed to cover the wiring layer 422, and the insulating film 420 is subjected to chemical mechanical polishing (CMP) treatment or etching treatment so that the top surface of the wiring layer 422 is exposed (see FIG. 3B).

The insulating film 420 can be formed by a plasma CVD method, a sputtering method, or the like with the use of silicon oxide, silicon oxynitride, aluminum oxide, aluminum oxynitride, hafnium oxide, gallium oxide, silicon nitride, silicon nitride oxide, aluminum nitride, aluminum nitride oxide, or a mixed material of any of these. Alternatively, the insulating film 420 can be formed with the use of zirconium oxide, cerium oxide, neodymium oxide, gadolinium oxide, or a mixed material of any of these. As described above, one or more oxides selected from the constituent elements of the oxide semiconductor film 403 is used for the insulating film 420, whereby an interface between the insulating film 420 and the oxide semiconductor film 403 can be kept well.

The insulating film 420 may have either a single-layer structure or a stacked-layer structure; an oxide insulating film is preferably used as the film in contact with the oxide semiconductor film 403. In this embodiment, a silicon oxide film is formed by a sputtering method as the insulating film 420.

It is preferable that the proportion of oxygen in the insulating film 420, which is in contact with the oxide semiconductor film 403, be higher than at least the stoichiometric proportion in the film (bulk). For example, in the case where a silicon oxide film is used as the insulating film 420, the composition formula is $SiO_{2+\alpha}$ ($\alpha>0$). By using the insulating film 420 described above, oxygen can be supplied to the oxide semiconductor film 403; accordingly, oxygen vacancy in the oxide semiconductor film 403 can be filled. By supply of oxygen to the oxide semiconductor film 403, the transistor 462 can have favorable characteristics.

For example, the insulating film 420 containing a large amount of (an excess of) oxygen, which is a supply source of oxygen, is provided to be in contact with the oxide semiconductor film 403, whereby oxygen can be supplied from the insulating film 420 to the oxide semiconductor film 403. Oxygen may be supplied to the oxide semiconductor film 403 by performing heat treatment in the state where the oxide semiconductor film 403 and the insulating film 420 are at least partly in contact with each other.

The CMP treatment is treatment for planarizing a surface of an object to be processed by a combination of chemical and mechanical actions, using the surface as a reference. In general, the CMP treatment is treatment in which a polishing cloth is attached to a polishing stage, the polishing stage and the object are each rotated or swung while a slurry (an abrasive) is supplied between the object and the polishing cloth, and the surface of the object is polished by chemical reaction of the slurry and the surface of the object and by action of mechanical polishing of the object with the polishing cloth.

The CMP treatment may be performed once or plural times. When the CMP treatment is performed plural times, first polishing is preferably performed with a high polishing rate followed by final polishing with a low polishing rate. By performing polishing at different polishing rates, the flatness of the surface of the insulating layer 136 can be further improved.

Note that in this embodiment, the top surface of the wiring layer 422 is exposed from the insulating film 420, but the structure is not limited thereto. For example, the top surface of the wiring layer 422 may be covered with the insulating film 420. In that case, the insulating film 420 also serves as a dielectric substance of the capacitor 464.

Next, an oxide semiconductor film is formed over the insulating film 420 and is patterned into an island shape to overlap with the wiring layer 422, so that the oxide semiconductor film 403 is formed.

In order that hydrogen or water does not enter the oxide semiconductor film 403 as much as possible during the formation of the oxide semiconductor film 403, the following is preferably performed as a pretreatment of the formation of the oxide semiconductor film 403: the substrate provided with the insulating film 420 is heated in a preheating chamber of a sputtering apparatus so that impurities such as hydrogen and moisture adsorbed onto the substrate and the insulating film 420 are removed and exhausted. As an exhaustion unit provided in the preheating chamber, a cryopump is preferable.

An oxide semiconductor used for the oxide semiconductor film 403 preferably contains at least indium (In) or zinc (Zn). In particular, In and Zn are preferably contained. In addition to these, one or more selected from rare earth elements (scandium (Sc), yttrium (Y), and lanthanoid) are preferably contained as a stabilizer for reducing variation in electric characteristics of a transistor including the oxide semiconductor. It is more preferable that one or more selected from cerium (Ce), neodymium (Nd), and gadolinium (Gd)), which are lanthanoid elements, be contained as the stabilizer. Alternatively, instead of the rare earth elements, one or more selected from zirconium (Zr) and titanium (Ti) may be contained as the stabilizer. With the use of the above-mentioned materials for the oxide semiconductor film 403, in a transistor including the oxide semiconductor film, the amount of variation in initial electric characteristics is very small, the ratio between on-state current and off-state current increases, the off-state current decreases, and hysteresis is also suppressed.

Examples of three-component metal oxides, which can be used as the oxide semiconductor, include In—Zr—Zn-based oxide, In—Ti—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, In—Lu—Zn-based oxide, In—Sc—Zn-based oxide, and In—Y—Zn-based oxide.

Note that In-M-Zn-based oxide (note that M represents one or more of the above-mentioned elements serving as a stabilizer), for example, refers to an oxide containing In, M, and Zn as its main components, and the ratio of In to M and Zn is not limited. The In-M-Zn-based oxide may contain another metal element in addition to In, M, and Zn.

For example, an In—Ce—Zn-based oxide having an atomic ratio of In:Ce:Zn=1:1:1, 3:1:2, or 2:1:3, or any of oxides whose composition is in the neighborhood of the compositions can be used. An In—Zr—Zn-based oxide having an atomic ratio of In:Zr:Zn=1:1:1, 3:1:2, or 2:1:3, or any of oxides whose composition is in the neighborhood of the compositions can be used. An In—Ti—Zn-based oxide having an atomic ratio of In:Ti:Zn=1:1:1, 3:1:2, or 2:1:3, or any of oxides whose composition is in the neighborhood of the compositions can be used.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

In an oxide semiconductor in an amorphous state, a flat surface can be obtained with relative ease, so that when a transistor is manufactured with the use of the oxide semiconductor, interface scattering can be reduced, and relatively high mobility can be obtained with relative ease.

In an oxide semiconductor having crystallinity, defects in the bulk can be further reduced and when the surface flatness of the oxide semiconductor is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness ($R_a$) of less than or equal to 1 nm, preferably less than or equal to 0.3 nm, more preferably less than or equal to 0.1 nm.

Note that, $R_a$ is obtained by expanding, into three dimensions, arithmetic mean surface roughness that is defined by JIS B 0601:2001 (ISO4287:1997) so as to be applied to a curved surface. The $R_a$ can be expressed as an "average value of the absolute values of deviations from a reference surface to a specific surface" and is defined by the formula below.

$$R_a = \frac{1}{S_0} \int_{y_1}^{y_2} \int_{x_1}^{x_2} |f(x, y) - Z_0| \, dx \, dy \quad \text{[FORMULA 1]}$$

Here, the specific surface is a surface which is a target of roughness measurement, and is a quadrilateral region which is specified by four points represented by the coordinates ($x_1$, $y_1$, $f(x_1, y_1)$), ($x_1$, $y_2$, $f(x_1, y_2)$), ($x_2$, $y_1$, $f(x_2, y_1)$), and ($x_2$, $y_2$, $f(x_2, y_2)$). Moreover, $S_0$ represents the area of a rectangle which is obtained by projecting the specific surface on the xy plane, and $Z_0$ represents the height of the reference surface (the average height of the specific surface). The $R_a$ can be measured with an atomic force microscope (AFM).

Therefore, planarization treatment may be performed on the region of the insulating film 420, which is in contact with the oxide semiconductor film 403. There is no particular limitation on the plararization treatment, and polishing treatment (e.g., CMP treatment), dry etching treatment, or plasma treatment can be used. The plarnarization treatment can also serve as the step of exposing the wiring layer 422.

As plasma treatment, reverse sputtering in which an argon gas, for example, is introduced and plasma is generated can be performed. The reverse sputtering is a method in which voltage is applied to a substrate side with use of an RF power supply under an argon atmosphere and plasma is generated in the vicinity of the substrate so that a substrate surface is modified. Note that instead of an argon atmosphere, a nitrogen atmosphere, a helium atmosphere, an oxygen atmosphere, or the like may be used. The reverse sputtering can remove particle substances (also referred to as particles or dust) attached to the surface of the insulating film 420.

As the planarization treatment, polishing treatment, dry etching treatment, or plasma treatment may be performed plural times, or these treatments may be performed in combination. In the case where the treatments are combined, the order of steps may be set as appropriate, without particular limitation, depending on the unevenness of the surface of the insulating film 420.

As the oxide semiconductor film 403, an oxide semiconductor film including a crystal and having crystallinity (crystalline oxide semiconductor film) can be used. The crystals in the crystalline oxide semiconductor film may have crystal axes oriented in random directions or in a certain direction. For example, the above-mentioned CAAC-OS film, which is crystalline oxide semiconductor film, can be used as the oxide semiconductor film 403.

The CAAC-OS film can be obtained by any of the following three methods. The first is a method in which an oxide semiconductor film is deposited at a temperature(s) higher than or equal to 200° C. and lower than or equal to 500° C. such that the c-axis is substantially perpendicular to the surface. The second is a method in which an oxide semiconductor film is deposited thin, and is subjected to heat treatment at a temperature(s) higher than or equal to 200° C. and lower than or equal to 700° C., so that the c-axis is substantially perpendicular to the top surface. The third is a method in which a first-layer oxide semiconductor film is deposited thin, and is subjected to heat treatment at a temperature(s) higher than or equal to 200° C. and lower than or equal to 700° C., and a second-layer oxide semiconductor film is deposited thereover, so that the c-axis is substantially perpendicular to the top surface.

The oxide semiconductor film 403 has a thickness greater than or equal to 1 nm and less than or equal to 200 nm (preferably greater than or equal to 5 nm and less than or equal to 30 nm) and can be formed by a sputtering method, a molecular beam epitaxy (MBE) method, a CVD method, a pulse laser deposition method, an atomic layer deposition (ALD) method, or the like as appropriate. The oxide semiconductor film 403 may be formed with a sputtering apparatus which performs deposition in the state where top surfaces of a plurality of substrates are substantially perpendicular to a top surface of a sputtering target.

Note that it is preferable that the oxide semiconductor film be formed under a condition that much oxygen is contained during film formation (e.g., formed by a sputtering method under a 100% oxygen atmosphere), so that a film containing much oxygen (preferably including a region whose oxygen proportion is higher than the stoichiometric proportion in the oxide semiconductor in a crystalline state) is formed.

An oxide semiconductor film is formed by a sputtering method as follows: for example, an In—Ce—Zn film can be formed with the use of an oxide target having an atomic ratio of In:Ce:Zn=1:1:1, In:Ce:Zn=3:1:2, or In:Ce:Zn=2:1:3. Alternatively, an In—Zr—Zn film can be formed with the use of an oxide target having an atomic ratio of In:Zr:Zn=1:1:1, In:Zr:Zn=3:1:2, or In:Zr:Zn=2:1:3. Further alternatively, an In—Ti—Zn film can be formed with the use of an oxide target having an atomic ratio of In:Ti:Zn=1:1:1, In:Ti:Zn=3:1:2, or In:Ti:Zn=2:1:3.

The filling rate of the metal oxide target is higher than or equal to 90% and lower than or equal to 100%, preferably higher than or equal to 95% and lower than or equal to 99.9%. With the use of the metal oxide target with high filling rate, a dense oxide semiconductor film can be formed.

It is preferable that a high-purity gas from which an impurity such as hydrogen, water, a hydroxyl group, or hydride is removed be used as a sputtering gas for the formation of the oxide semiconductor film.

The substrate is held in a deposition chamber kept under reduced pressure. Then, moisture remaining in the deposition chamber is removed, a sputtering gas from which hydrogen and moisture are removed is introduced, and the above target is used, so that the oxide semiconductor film is formed over the substrate 400. In order to remove moisture remaining in the deposition chamber, an entrapment vacuum pump such as a cryopump, an ion pump, or a titanium sublimation pump is preferably used. As an exhaustion unit, a turbo molecular pump provided with a cold trap may be used. In the deposition chamber which is exhausted with the cryopump, a hydrogen atom, a compound containing a hydrogen atom, such as water ($H_2O$), (more preferably, also a compound containing a carbon atom), and the like are removed, whereby the concentration of an impurity in the oxide semiconductor film formed in the deposition chamber can be reduced.

The insulating film 420 and the oxide semiconductor film are preferably formed in succession without exposure to the air. When the insulating film 420 and the oxide semiconductor film are formed in succession without exposure to the air, impurities such as hydrogen and moisture can be prevented from being adsorbed onto a surface of the insulating film 420.

Further, heat treatment may be performed on the oxide semiconductor film in order to remove excess hydrogen (including water and a hydroxyl group) (to perform dehydration or dehydrogenation). The temperature of the heat treatment is higher than or equal to 300° C. and lower than or equal to 700° C., or lower than the strain point of the substrate. The heat treatment can be performed under reduced pressure, a nitrogen atmosphere, or the like. For example, after the substrate is put in an electric furnace which is a kind of heat treatment apparatus, heat treatment is performed on the oxide semiconductor film at 450° C. for one hour under a nitrogen atmosphere.

Note that the heat treatment apparatus used is not limited to an electric furnace, and a device for heating an object to be processed by heat conduction or heat radiation from a heating element such as a resistance heating element may be alternatively used. For example, a rapid thermal anneal (RTA) apparatus such as a gas rapid thermal anneal (GRTA) apparatus or a lamp rapid thermal anneal (LRTA) apparatus can be used. A GRTA apparatus is an apparatus for heat treatment using a high-temperature gas. As the high-temperature gas, an inert gas which does not react with an object to be processed by heat treatment, such as nitrogen or a rare gas such as argon, is used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp.

For example, as the heat treatment, GRTA may be performed as follows. The substrate is put in an inert gas heated at high temperature of 650° C. to 700° C., is heated for several minutes, and is taken out of the inert gas.

Such heat treatment for dehydration or dehydrogenation can be performed in the manufacturing process of the transistor 462 anytime after the formation of the oxide semiconductor film 403 and before addition of oxygen into the oxide semiconductor film 403. For example, the heat treatment may be performed during the formation of a film containing a metal element.

The heat treatment for dehydration or dehydrogenation is preferably performed before the oxide semiconductor film is processed into an island shape, whereby oxygen included in the insulating film 420 can be prevented from being released by the heat treatment.

Note that in the heat treatment, it is preferable that moisture, hydrogen, and the like be not contained in nitrogen or a rare gas such as helium, neon, or argon. The purity of nitrogen or the rare gas such as helium, neon, or argon which is introduced into the heat treatment apparatus is preferably set to 6N (99.9999%) or higher, more preferably 7N (99.99999%) or higher (i.e., the impurity concentration is preferably 1 ppm or lower, more preferably 0.1 ppm or lower).

After the oxide semiconductor film is heated by the heat treatment, a high-purity oxygen gas, a high-purity dinitrogen monoxide gas, or ultra dry air (the moisture amount is less than or equal to 20 ppm (−55° C. by conversion into a dew point), preferably less than or equal to 1 ppm, or more preferably less than or equal to 10 ppb, in the case where measurement is performed with use of a dew point meter of a cavity ring down laser spectroscopy (CRDS) system) may be introduced into the same furnace. It is preferable that water, hydrogen, and the like be not contained in the oxygen gas or the dinitrogen monoxide gas. Alternatively, the purity of the oxygen gas or the dinitrogen monoxide gas which is introduced into the heat treatment apparatus is preferably 6N or higher, further preferably 7N or higher (i.e., the impurity concentration in the oxygen gas or the dinitrogen monoxide gas is preferably 1 ppm or lower, further preferably 0.1 ppm or lower). By the effect of the oxygen gas or the dinitrogen monoxide gas, oxygen which is a main component of the oxide semiconductor and which has been reduced at the same time as the step for removing impurities by dehydration or dehydrogenation is supplied, so that the oxide semiconductor film can be a high-purity and electrically i-type (intrinsic) oxide semiconductor film.

The oxide semiconductor film 403 is formed by processing the formed oxide semiconductor film into an island shape through a photolithography process. A resist mask for forming the island-shaped oxide semiconductor film 403 may be formed by an inkjet method. Formation of the resist mask by an inkjet method needs no photomask, which leads to a reduction in manufacturing cost.

Note that either dry etching or wet etching, or both may be employed for the etching of the oxide semiconductor film. As an etchant used for wet etching of the oxide semiconductor film, for example, a mixed solution of phosphoric acid, acetic acid, and nitric acid, can be used. ITO07N (produced by KANTO CHEMICAL CO., INC.) may also be used.

Next, a gate insulating film 432 is formed over the oxide semiconductor film 403.

The surface of the oxide semiconductor film 403 may also be subjected to the above planarization treatment in order to be more favorably covered with the gate insulating film 432. The surface of the oxide semiconductor film 403 is preferably flat particularly in the case where a thin insulating film is used as the gate insulating film 432.

The gate insulating film 432 can have a thickness of 1 nm to 100 nm and can be formed by a sputtering method, an MBE method, a CVD method, a pulse laser deposition method, an ALD method, or the like as appropriate. The gate insulating film 432 may be formed with a sputtering apparatus which performs film formation with surfaces of a plurality of substrates set substantially perpendicular to a surface of a sputtering target, which is so called a columnar plasma (CP) sputtering system.

Examples of a material for the gate insulating film 432 include a silicon oxide film, a gallium oxide film, an aluminum oxide film, a silicon nitride film, a silicon oxynitride film, an aluminum oxynitride film, and a silicon nitride oxide film. It is preferable that the gate insulating film 432 include oxygen in a portion which is in contact with the oxide semiconductor film 403. In particular, it is preferable that the proportion of oxygen in the gate insulating film 432 be higher than at least the stoichiometric proportion in the film (bulk). For example, in the case where a silicon oxide film is used as the gate insulating film 432, the composition formula is $SiO_{2+\alpha}$ ($\alpha>0$). In this embodiment, a silicon oxide film of $SiO_{2+\alpha}$ ($\alpha>0$) is used as the gate insulating film 432. By using the silicon oxide film as the gate insulating film 432, oxygen can be supplied to the oxide semiconductor film 403, leading to good characteristics. Furthermore, the gate insulating film 432 is preferably formed in consideration of the size of a transistor to be formed and the step coverage with the gate insulating film 432.

The gate insulating film 432 can be formed with the use of a high-k material such as hafnium oxide, yttrium oxide, hafnium silicate ($HfSi_xO_y$, (x>0, y>0)), hafnium silicate to which nitrogen is added ($HfSiO_xN_y$, (x>0, y>0)), hafnium aluminate ($HfAl_xO_y$, (x>0, y>0)), or lanthanum oxide, whereby gate leakage current can be reduced. In addition, the gate insulating film 432 can be formed with the use of zirconium oxide, cerium oxide, neodymium oxide, gadolinium oxide, or a mixed material thereof. As described above, one or more oxides selected from the constituent elements of the oxide semiconductor film 403 is used for the gate insulating film 432, whereby an interface between the gate insulating film 432 and the oxide semiconductor film 403 can be kept well. Furthermore, the gate insulating film 432 may have either a single-layer structure or a stacked-layer structure.

Figure 3C:
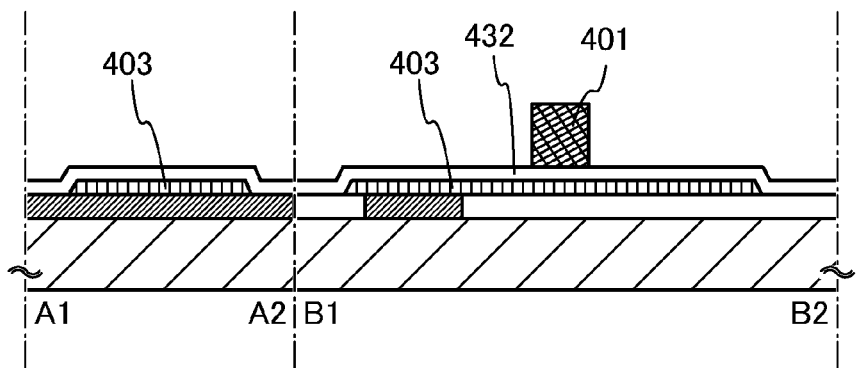

Next, a conductive film is formed by a plasma CVD method, a sputtering method, or the like and is selectively patterned to form the gate electrode layer 401 over the gate insulating film 432 (see FIG. 3C). The gate electrode layer 401 can be formed with a metal material such as molybdenum, titanium, tantalum, tungsten, copper, chromium, neodymium, or scandium or an alloy material containing any of these materials as its main component. Alternatively, a semiconductor film typified by a polycrystalline silicon film doped with an impurity element such as phosphorus, or a silicide film such as a nickel silicide film may be used as the gate electrode layer 401. The gate electrode layer 401 may have a single-layer structure or a stacked-layer structure. In this embodiment, the gate electrode layer 401 is formed with tungsten.

The gate electrode layer 401 can also be formed with a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible that the gate electrode layer 401 has a stacked-layer structure of the above conductive material and the above metal material.

As one layer in the stacked-layer structure of the gate electrode layer 401, which is in contact with the gate insulating film 432, metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. These films have a work function of 5 eV or higher, preferably 5.5 eV or higher. In the case of any of these films is used as the gate electrode layer 401, the threshold voltage, which is one of the electric characteristics of a transistor, can be positive; accordingly, a so-called normally-off switching element can be provided.

Figure 3D:
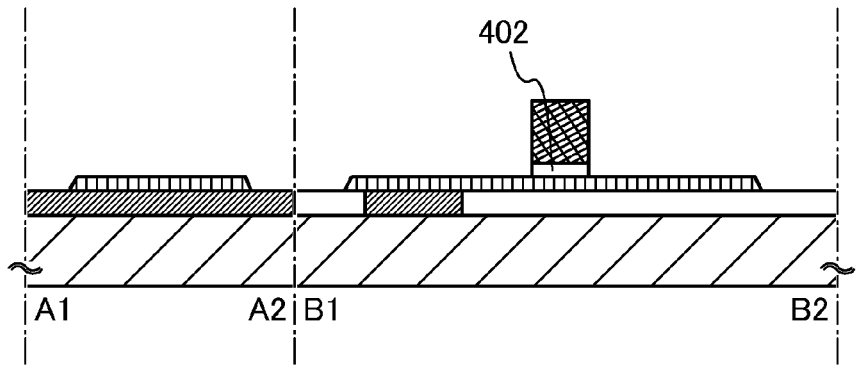

Next, the gate insulating film 432 is etched using the gate electrode layer 401 as a mask to expose part of the oxide semiconductor film 403, so that the gate insulating film 402 is formed (see FIG. 3D).

Figure 4A:
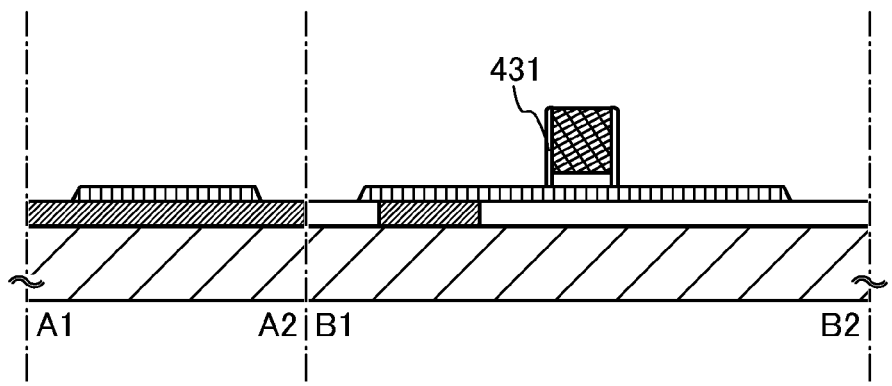
FIGS. 4A to 4C are cross-sectional views illustrating manufacturing steps of the semiconductor device according to one embodiment of the present invention.

Next, an insulating film is formed over the oxide semiconductor film 403, the gate insulating film 402, and the gate electrode layer 401, and is subjected to anisotropic etching, so that a sidewall insulating film 431 is formed in a self-aligned manner to be in contact with a side surface of the gate electrode layer 401 (see FIG. 4A).

Here, the thickness of the sidewall insulating film 431 is preferably 1 nm to 10 nm, more preferably 3 nm to 5 nm. Note that the thickness of the sidewall insulating film 431 is not limited thereto and can be set as appropriate.

There is no particular limitation on the sidewall insulating film 431; for example, a silicon oxide film with favorable step coverage, which is formed by reacting TEOS (tetraethyl orthosilicate), silane, or the like with oxygen, nitrous oxide, or the like can be used. The sidewall insulating film 431 can be formed by a thermal CVD method, a plasma CVD method, an atmospheric pressure CVD method, a bias ECRCVD method, a sputtering method, or the like. A silicon oxide film formed by a low temperature oxidation (LTO) method may also be used.

Here, the etching of the sidewall insulating film 431 can be performed by, for example, a reactive ion etching (RIE) method.

By providing the sidewall insulating film 431 with a small thickness in this manner, short-circuit between the gate and the source and the drain of the transistor 462 can be prevented.

Note that the sidewall insulating film 431 is not necessarily provided and the structure in which the transistor 462 does not include the sidewall insulating film 431 may be employed.

Figure 4B:
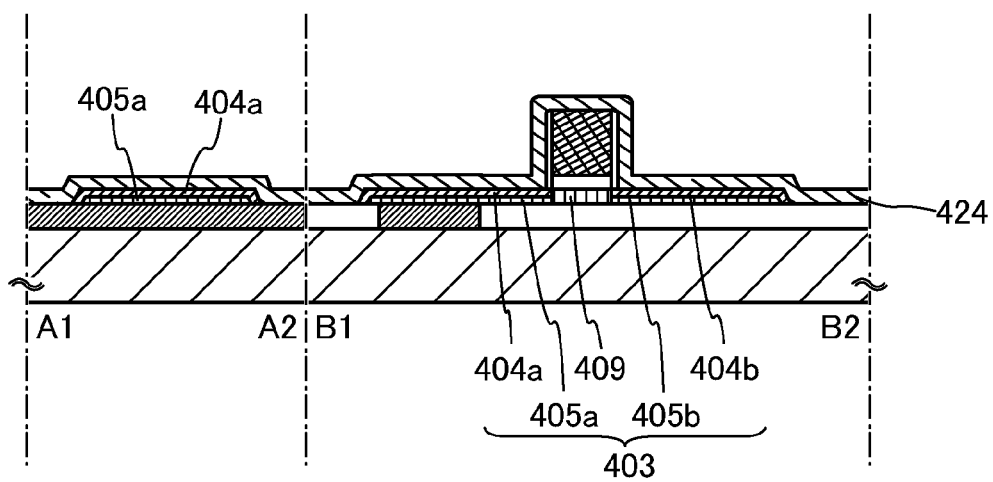

Next, over the oxide semiconductor film 403, the gate insulating film 402, and the gate electrode layer 401, a metal-element-containing film 424 is formed to be in contact with part of the oxide semiconductor film 403 while the substrate 400 is being heated (see FIG. 4B). The temperature of thermal deposition for the metal-element-containing film 424 is higher than or equal to 100° C. and lower than or equal to 700° C., preferably higher than or equal to 200° C. and lower than or equal to 400° C.

Examples of the metal-element-containing film 424 include a metal film, a metal oxide film, and a metal nitride film. It is preferable that a metal element contained in the metal-element-containing film 424 be different from the metal element contained in the channel formation region 409 in the oxide semiconductor film 403.

As the metal element included in the film containing a metal element, one or more selected from aluminum (Al), titanium (Ti), molybdenum (Mo), tungsten (W), hafnium (Hf), tantalum (Ta), lanthanum (La), barium (Ba), magnesium (Mg), zirconium (Zr), and nickel (Ni) can be used. As the film containing a metal element, a metal film, a metal oxide film, or a metal nitride film containing at least one of the above-described metal elements (e.g., a titanium nitride film, a molybdenum nitride film, or a tungsten nitride film) can be used. Further, a dopant such as phosphorus (P) or boron (B) may be included in the film containing a metal element. In this embodiment, the metal-element-containing film 424 has electrical conductivity.

The metal-element-containing film 424 can be formed by a plasma CVD method, a sputtering method, an evaporation method, or the like. The thickness of the metal-element-containing film 424 may be greater than or equal to 5 nm and less than or equal to 30 nm.

In this embodiment, a 10-nm-thick aluminum film is formed by a sputtering method as the metal-element-containing film 424.

The thermal deposition may be performed under an atmosphere of nitrogen, ultra-dry air (air in which the water content is 20 ppm or less, preferably 1 ppm or less, more preferably 10 ppb or less), or a rare gas (argon, helium, or the like). Note that it is preferable that water, hydrogen, and the like be not contained in the atmosphere of nitrogen, ultra-dry air, or a rare gas. It is also preferable that the purity of nitrogen or a rare gas which is introduced into a heat treatment apparatus be 6N (99.9999%) or higher, preferably 7N (99.99999%) or higher (i.e., the impurity concentration is 1 ppm or lower, preferably 0.1 ppm or lower). Alternatively, the thermal deposition may be performed under reduced pressure or in a vacuum.

By the thermal deposition of the metal-element-containing film 424, the metal element(s) contained in the metal-element-containing film 424 is introduced into the oxide semiconductor film 403. Thus, the channel formation region 409 is formed in a self-aligned manner in a region of the oxide semiconductor film 403, which overlaps with the gate electrode layer 401. A metal element is added to superficial portions in the regions between which the channel formation region 409 is sandwiched in the channel length direction, thereby forming the source region 404a and the drain region 404b having a lower resistance than the channel formation region 409. In the oxide semiconductor film 403, regions to which the metal element is not added and which overlap with the source region 404a and the drain region 404b are referred to as high-resistance region 405a and high-resistance region 405b. The high-resistance region 405a and high-resistance region 405b have higher resistance than the source region 404a and the drain region 404b.

By provision of the source region 404a and the drain region 404b which contain a metal element and have lower resistance than the channel formation region 409 in the oxide semiconductor film 403 of the transistor 462, the transistor 462 can have excellent on-state characteristics (e.g., on-state current and field effect mobility), leading to high-speed operation and quick response.

Note that in the step illustrated in FIG. 4B, the metal element is introduced into the oxide semiconductor film 403 by the thermal deposition of the metal-element-containing film 424, but one embodiment of the present invention is not limited thereto. For example, the metal-element-containing film 424 may be formed at room temperature, or may be formed by being heated at temperature at which the metal element is not introduced into the oxide semiconductor film 403 (e.g., temperature lower than 100° C.) and be subjected to heat treatment after the formation. The heating temperature may be set to higher than or equal to 100° C. and lower than or equal to 700° C., preferably higher than or equal to 200° C. and lower than or equal to 400° C.

Figure 4C:
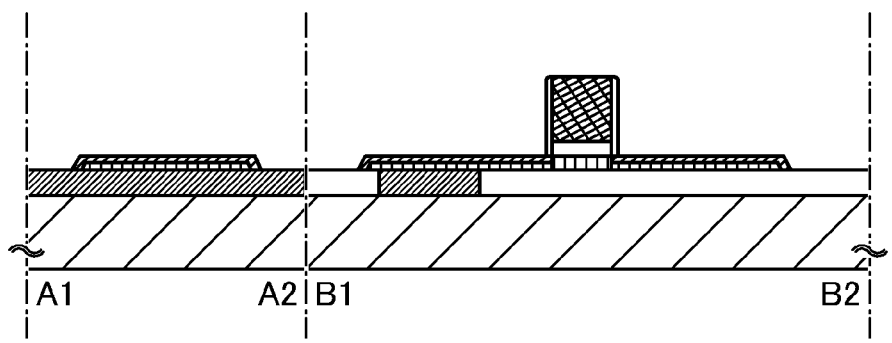

Next, the metal-element-containing film 424 is removed by etching (see FIG. 4C). For the etching of the metal-element-containing film 424, wet etching or dry etching may be used, and etching conditions may be set as appropriate. Here, since wet etching can be employed, the metal-element-containing film 424 can be removed without performing plasma treatment; accordingly, the semiconductor device can be prevented from being broken due to ESD caused by plasma damage.

Figure 5A:
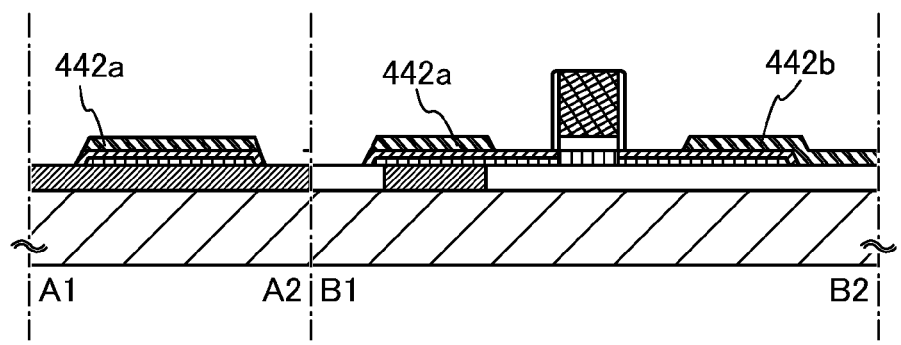
FIGS. 5A and 5B are cross-sectional views illustrating manufacturing steps of the semiconductor device according to one embodiment of the present invention.

Next, a conductive layer for forming a source electrode layer and a drain electrode layer is formed over the oxide semiconductor film 403 and the like and is processed into the source electrode layer 442a and the drain electrode layer 442b (see FIG. 5A). Here, the source electrode layer 442a is in contact with the source region 404a in the oxide semiconductor film 403, and the drain electrode layer 442b is in contact with the drain region 404b in the oxide semiconductor film 403.

The conductive layer can be formed by a PVD method or a CVD method. As a material for the conductive layer, an element selected from aluminum, chromium, copper, tantalum, titanium, molybdenum, and tungsten; an alloy containing any of these elements as a component; or the like can be used. Further, one or more materials selected from manganese, magnesium, zirconium, beryllium, neodymium, and scandium may be used.

The conductive layer may have a single-layer structure or a stacked-layer structure including two or more layers. For example, the conductive layer can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked in this order.

Alternatively, the conductive layer may be formed with the use of conductive metal oxide. Examples of the conductive metal oxide include indium oxide ($In_2O_3$), tin oxide ($SnO_2$), zinc oxide (ZnO), indium tin oxide ($In_2O_3$—$SnO_2$, which is abbreviated to ITO in some cases), indium zinc oxide ($In_2O_3$—ZnO), and any of these metal oxide materials which contains silicon or silicon oxide.

Note that in the steps illustrated in FIG. 4C and FIG. 5A, the metal-element-containing film 424 is completely removed, and then, the source electrode layer 442a and the drain electrode layer 442b are formed, but one embodiment of the present invention is not limited thereto. For example, the metal-element-containing film 424 may be partly removed, and the remaining metal-element-containing film 424 may be used as the source electrode layer 442a and the drain electrode layer 442b.

Then, the insulating film 425 is formed to cover the transistor 462.

The insulating film 425 is preferably formed by a method such as a sputtering method, by which impurities such as water and hydrogen does not enter the insulating film 425, as appropriate. It is preferable that the insulating film 425 include much oxygen because it serves as a supply source of oxygen to the oxide semiconductor film 403.

In this embodiment, a 100-nm-thick silicon oxide film is formed as the insulating film 425 by a sputtering method. The silicon oxide film can be formed by a sputtering method under a rare gas (typically, argon) atmosphere, an oxygen atmosphere, or a mixed atmosphere containing a rare gas and oxygen.

To remove residual moisture from the deposition chamber of the insulating film 425 in a manner similar to that of the formation of the oxide semiconductor film, an entrapment vacuum pump (e.g., a cryopump) is preferably used. When the insulating film 425 is formed in the deposition chamber exhausted with a cryopump, the impurity concentration in the insulating film 425 can be reduced. As an exhaustion unit for removing residual moisture in the deposition chamber of the insulating film 425, a turbo molecular pump provided with a cold trap may be used.

A high-purity gas from which impurities such as hydrogen, water, a hydroxyl group, and hydride are removed is preferably used as a sputtering gas used in the formation of the insulating film 425.

In the case where the insulating film 425 has a stacked-layer structure, a silicon oxide film and an inorganic insulating film typified by an aluminum oxide film, a silicon oxynitride film, an aluminum oxynitride film, or a gallium oxide film can be used. For example, as the insulating film 425, a stacked layer of a silicon oxide film and an aluminum oxide film can be used.

In order to reduce surface unevenness caused by a transistor, the insulating film 426 serving as a planarization insulating film may be formed. For the insulating film 426, an organic material such as a polyimide-based resin, an acrylic-based resin, or a benzocyclobutene-based resin can be used. Other than such organic materials, it is possible to use a low-dielectric constant material (a low-k material) or the like. Alternatively, the insulating film 426 may be formed by stacking plural insulating films formed with any of these materials.

After the formation of the insulating film 425, heat treatment may be performed under an inert gas atmosphere or an oxygen atmosphere. The heat treatment temperature is preferably higher than or equal to 200° C. and lower than or equal to 450° C., and more preferably higher than or equal to 250° C. and lower than or equal to 350° C. With such a heat treatment, variations in electric characteristics of the transistor 462 can be reduced. Further, in the case where the insulating film 420, the gate insulating film 402, or the insulating film 425 contains oxygen, oxygen can be supplied to the oxide semiconductor film 403 to fill oxygen vacancy in the oxide semiconductor film 403. As described above, the heat treatment has an effect of supplying oxygen; therefore, the heat treatment can also be referred to as supply of oxygen. The heat treatment for the metal-element-containing film 424 can also function as the supply of oxygen.

Finally, an opening reaching the drain electrode layer 442b is formed in the insulating film 425 and the insulating film 426. Over the insulating film 425 and the insulating film 426, the wiring layer 456 is formed to be in contact with the drain electrode layer 442b through the opening (see FIG. 5B).

Examples of a conductive film used for the wiring layer 456 include a metal film containing an element selected from Al, Cr, Cu, Ta, Ti, Mo, and W, and a metal nitride film containing any of the above elements as a component (e.g., a titanium nitride film, a molybdenum nitride film, or a tungsten nitride film). A metal film having a high melting point such as Ti, Mo, or W, or a metal nitride film of any of these elements (a titanium nitride film, a molybdenum nitride film, or a tungsten nitride film) may be stacked on one of or both of a lower side and an upper side of the metal film of Al, Cu, or the like.

A resist mask is formed over the conductive film through a photolithography process and selective etching is performed, whereby the wiring layer 456 can be formed.

In this manner, the transistor 462 and the capacitor 464 can be formed. The transistor 462 includes the oxide semiconductor film 403 over the substrate 400 with the insulating film 420 provided therebetween, the source electrode layer 442a and the drain electrode layer 442b formed in contact with the oxide semiconductor film 403, the gate electrode layer 401 formed over and to overlap with the oxide semiconductor film 403, and the gate insulating film 402 provided between the oxide semiconductor film 403 and the gate electrode layer 401. The capacitor 464 includes the source electrode layer 442a, the high-resistance region 405a, and the wiring layer 422 under the oxide semiconductor film 403 and overlapping with the high-resistance region 405a.

In the oxide semiconductor film 403 which is highly purified and whose oxygen vacancy is filled, impurities such as hydrogen and water are sufficiently removed; the hydrogen concentration in the oxide semiconductor film 403 is less than or equal to $5\times10^{19}$ atoms/cm$^3$, preferably less than or equal to $5\times10^{18}$ atoms/cm$^3$, more preferably less than or equal to $5\times10^{17}$ atoms/cm$^3$.

The amount of carriers in the oxide semiconductor film 403 is extremely small (close to zero). The carrier concentration is less than $1\times10^{12}$/cm$^3$, preferably less than $1\times10^{11}$/cm$^3$, more preferably less than $1.45\times10^{10}$/cm$^3$.

The transistor 462 formed according to this embodiment, which includes the highly purified oxide semiconductor film 403 containing excessive oxygen with which oxygen vacancy is filled, can have a current value in an off state (off-state current value) of less than or equal to 100 zA per micrometer of channel width at room temperature, preferably less than or equal to 10 zA/μm, more preferably less than or equal to 1 zA/μm, even more preferably less than or equal to 100 yA/μm.

As described above, the off-state current of a transistor including an oxide semiconductor that is a wide-bandgap semiconductor is sufficiently small; therefore, the semiconductor device including the transistor in this embodiment can hold data for an extremely long time. In other words, power consumption can be sufficiently reduced because refresh operation becomes unnecessary or the frequency of refresh operation can be extremely low. Moreover, stored data can be held for a long time even when power is not supplied for a certain time (note that the potential is preferably fixed).

Furthermore, in the semiconductor device in this embodiment, a wiring layer provided under a transistor, a high-resistance region in an oxide semiconductor film, and a source electrode are used to form a capacitor. Therefore, the area occupied by a transistor and a capacitor can be reduced, whereby the degree of integration of a semiconductor device can be enhanced and the storage capacity per unit area can be increased.

The process for manufacturing the semiconductor device including the transistor 472 and the capacitor 464 illustrated in FIGS. 2A to 2C is described with reference to FIGS. 6A and 6B. The transistor 472 differs from the transistor 462 in that a low-resistance region 406a containing a dopant is formed between the source region 404a and the channel formation region 409, and a low-resistance region 406b containing a dopant is formed between the drain region 404b and the channel formation region 409. Note that the structure of the transistor 472 is the same as that of the transistor 462 except the above point, and the structure of the semiconductor device in FIGS. 2A to 2C other than the transistor 472 is the same as the structure of the semiconductor device in FIGS. 1A to 1C.

First, the steps from FIG. 3A to FIG. 5A are conducted in the same manners as those for manufacturing the semiconductor device in FIGS. 1A to 1C.

Figure 6A:
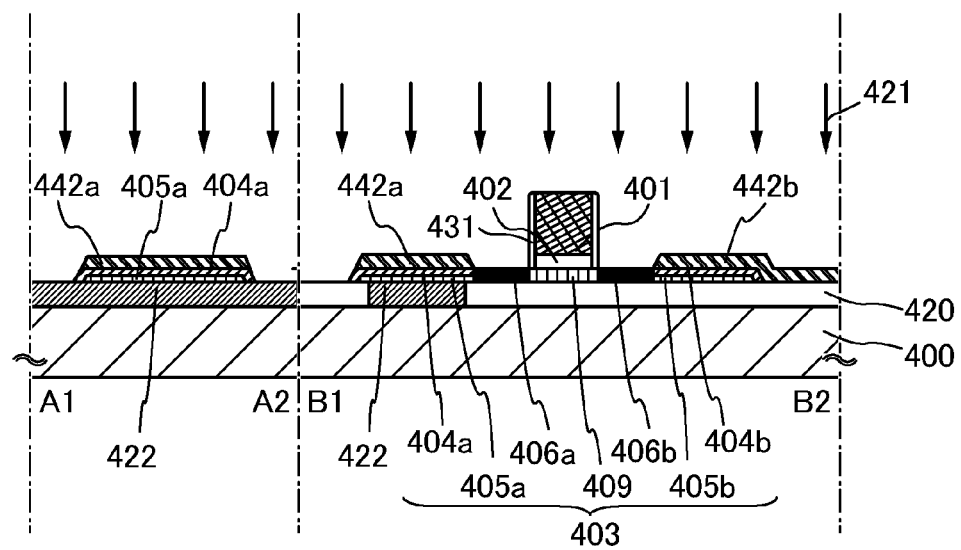
FIGS. 6A and 6B are cross-sectional views illustrating manufacturing steps of the semiconductor device according to one embodiment of the present invention.

Next, the dopant 421 is selectively added to the oxide semiconductor film 403 while the gate insulating film 402, the gate electrode layer 401, the source electrode layer 442a, and the drain electrode layer 442b are used as a mask, whereby the low-resistance region 406a containing the dopant is formed between the source region 404a and the channel formation region 409 and the low-resistance region 406b containing the dopant is formed between the drain region 404b and the channel formation region 409 (see FIG. 6A).

The dopant 421 is an impurity by which the electrical conductivity of the oxide semiconductor film 403 is changed.

One or more selected from the following can be used as the dopant 421: Group 15 elements (typified by phosphorus (P), arsenic (As), and antimony (Sb)), boron (B), aluminum (Al), nitrogen (N), argon (Ar), helium (He), neon (Ne), indium (In), fluorine (F), chlorine (Cl), titanium (Ti), and zinc (Zn).

As the method for adding the dopant 421, an ion implantation method, an ion doping method, a plasma immersion ion implantation method, or the like can be used. In that case, it is preferable to use a single ion of the dopant 421 or a hydride ion, a fluoride ion, or a chloride ion thereof.

The addition of the dopant 421 may be controlled by setting the addition conditions such as the accelerated voltage and the dosage, or the thickness of the metal-element-containing film 424 through which the dopant 421 passes, as appropriate. For example, for addition of an boron ion by an ion implantation method using boron, the accelerated voltage and the dosage may be set to 15 kV and $1\times10^{15}$ ions/cm$^2$, respectively. The dosage may be set to greater than or equal to $1\times10^{13}$ ions/cm$^2$ and less than or equal to $5\times10^{16}$ ions/cm$^2$.

The concentration of the dopant 421 in the source region or the drain region is preferably higher than or equal to $5\times10^{18}$/cm$^3$ and lower than or equal to $1\times10^{22}$/cm$^3$.

The addition of the dopant 421 into the oxide semiconductor film 403 may be performed plural times, and plural kinds of dopant may be used.

After the addition of the dopant 421, heat treatment may be performed thereon. The heat treatment is preferably performed at a temperature higher than or equal to 300° C. and lower than or equal to 700° C. (more preferably higher than or equal to 300° C. and lower than or equal to 450° C.) under a nitrogen atmosphere, reduced pressure, or the air (ultra dry air).

In the case where the oxide semiconductor film 403 is a crystalline oxide semiconductor film, the oxide semiconductor film 403 may be partly amorphized by the addition of the dopant 421. In that case, the crystallinity of the oxide semiconductor film 403 can be recovered by heat treatment performed after the addition of the dopant 421.

Figure 5B:
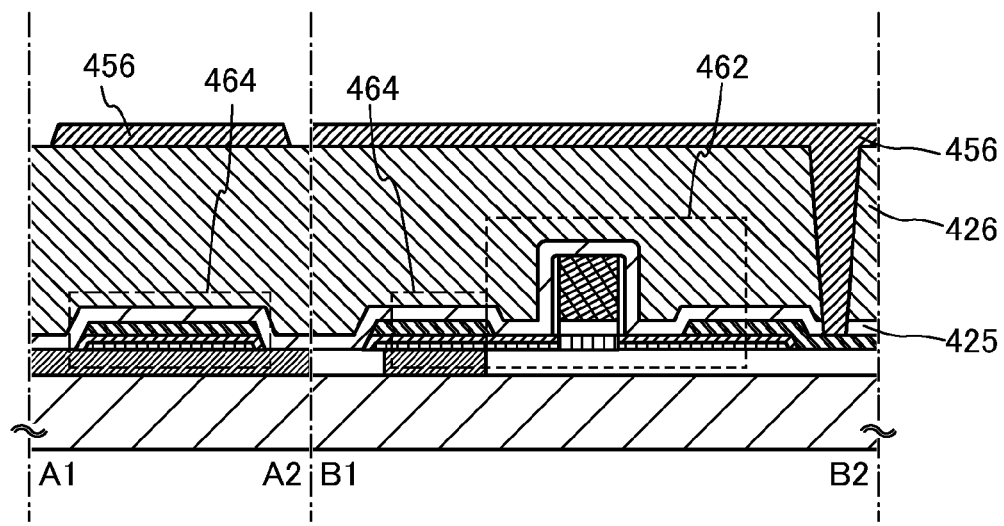
Figure 6B:
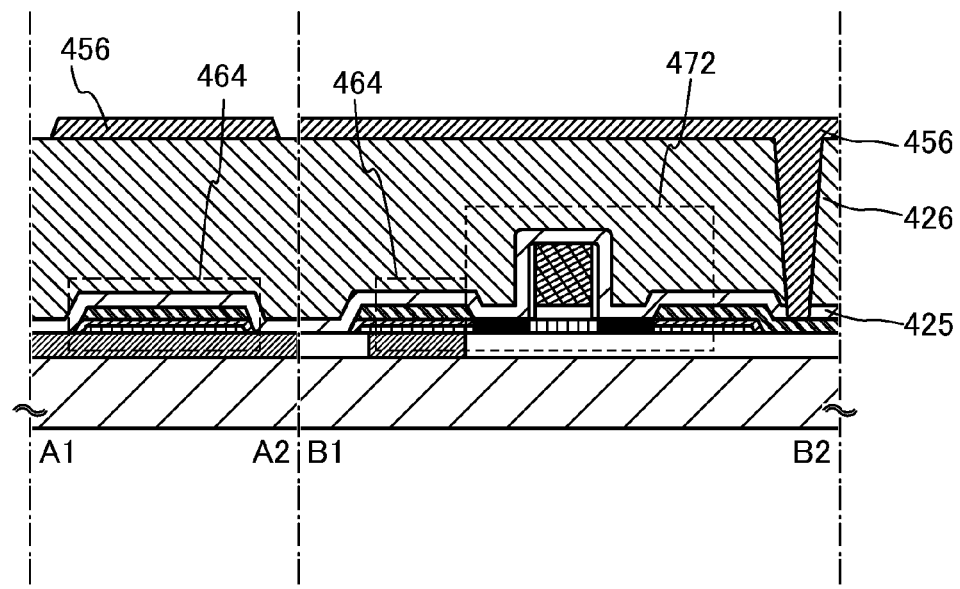

The insulating film 425, the insulating film 426, and the wiring layer 456 can be formed by the same method as that illustrated in FIG. 5B (see FIG. 6B).

By provision of the low-resistance region 406a and the low-resistance region 406b in this manner, on-state characteristics (e.g., on-state current and field effect mobility) of the transistor 472 can be further improved.

The structures and methods described in this embodiment can be combined as appropriate with any of the structures and methods described in the other embodiments.

(Embodiment 3)

In this embodiment, an example of a semiconductor device which includes a transistor 482 having a structure similar to the structure of the transistor 472 described in the above embodiment, which can hold stored data even when power is not supplied for a certain time, and which has no limitation on the number of write cycles, is described with reference to drawings.

Since the off-state current of the transistor 482 is small as the transistor 472, stored data can be held for a long time owing to such a transistor. In other words, power consumption can be sufficiently reduced because a semiconductor device in which refresh operation is unnecessary or the frequency of refresh operation is extremely low can be provided.

Figure 7A:
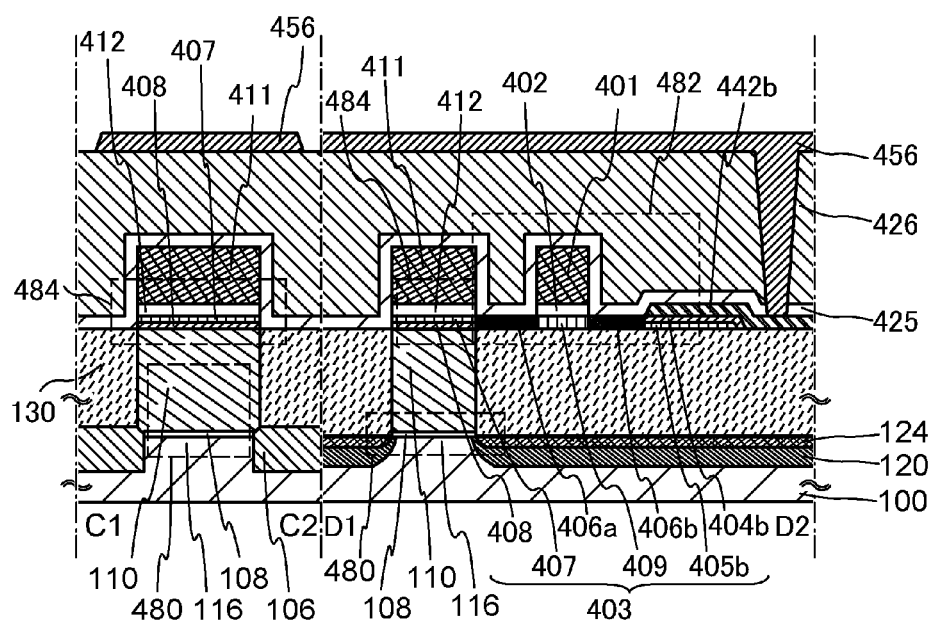
FIGS. 7A to 7C are a cross-sectional view, a plan view, and a circuit diagram of a semiconductor device according to one embodiment of the present invention.
Figure 7B:
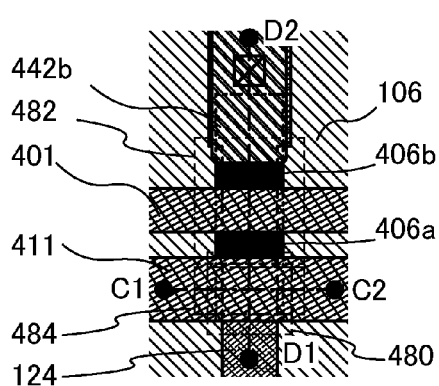
Figure 7C:
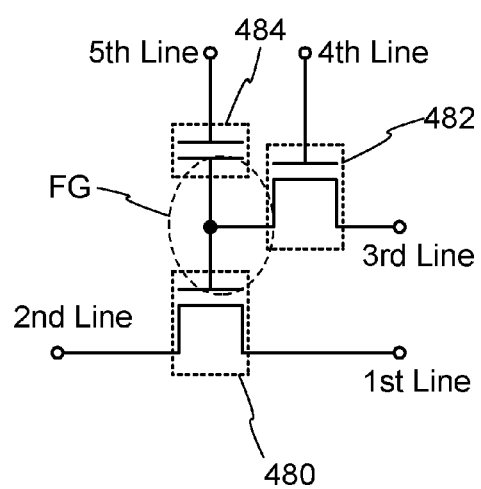

FIGS. 7A to 7C illustrate an example of a structure of a semiconductor device. FIG. 7A is a cross-sectional view, FIG. 7B is a plan view, and FIG. 7C is a circuit diagram of the semiconductor device. Here, FIG. 7A corresponds to a cross section taken along lines C1-C2 and D1-D2 of FIG. 7B.

The semiconductor device illustrated in FIGS. 7A and 7B includes, in the lower portion, a transistor 480 including a semiconductor material (e.g., silicon) other than an oxide semiconductor, and in the upper portion, a transistor 482 including an oxide semiconductor material like the transistor 472. The transistor 482 has the same structure as the transistor 472 described in the above embodiment; thus, in description of FIGS. 7A and 7B, the same reference numerals are used for the same parts as those in FIGS. 2A and 2B.

Here, a material of an active layer of the transistor 480 and a material of an active layer of the transistor 482 preferably have different bandgaps. For example, the active layer of the transistor 480 may be a semiconductor (e.g., silicon) and the active layer of the transistor 482 may be an oxide semiconductor. With the use of silicon or the like, the transistor 480 including a material other than an oxide semiconductor can operate at high speed easily. On the other hand, the transistor 482 including an oxide semiconductor enables charge to be held for a long time owing to its characteristics.

Although the transistors 480 and 482 are n-channel transistors here, it is needless to say that p-channel transistors can be used. The technical nature of the disclosed invention is to use a wide-bandgap semiconductor in the transistor 482 so that data can be held. Therefore, it is not necessary to limit a specific structure of the semiconductor device, such as a material of the semiconductor device or a structure of the semiconductor device, to the structure described here.

The transistor 480 in FIG. 7A includes a channel formation region 116 provided in a substrate 100 including a semiconductor material (e.g., silicon), impurity regions 120 by which the channel formation region 116 is sandwiched, metal compound regions 124 in contact with the impurity regions 120, a gate insulating layer 108 provided over the channel formation region 116, and a gate electrode layer 110 provided over the gate insulating layer 108. Here, the gate electrode layer 110 is preferably formed with the same material as the metal-element-containing film 424 described in the above embodiment.

Further, the substrate 100 is provided with an element isolation insulating layer 106 which surrounds the transistor 480. An insulating film 130 is provided to cover the transistor 480. Note that for high integration, it is preferable that, as in FIG. 7A, the transistor 480 do not have a sidewall insulating layer. On the other hand, when the characteristics of the transistor 480 have priority, the sidewall insulating layer may be formed on a side surface of the gate electrode layer 110 and the impurity regions 120 may include a region having a different impurity concentration.

As illustrated in FIG. 7A, the transistor 482 includes the oxide semiconductor film 403 provided over the insulating film 130, the drain electrode layer 442b provided in contact with the oxide semiconductor film 403, the gate electrode layer 401 provided over and to overlap with the oxide semiconductor film 403, and the gate insulating film 402 provided between the oxide semiconductor film 403 and the gate electrode layer 401. The insulating film 412 is formed over the oxide semiconductor film 403 with the same material and in the same step as the gate insulating film 402. The electrode layer 411 is formed over the insulating film 412 with the same material in the same step as the gate electrode layer 401. Here, the oxide semiconductor film 403 includes the channel formation region 409, the low-resistance region 406a and the low-resistance region 406b, the drain region 404b, and the high-resistance region 405b. The channel formation region 409 is formed to overlap with the gate electrode layer 401. The low-resistance region 406a and the low-resistance region 406b are formed so that the channel formation region 409 is sandwiched therebetween. The low-resistance region 406a and the low-resistance region 406b have a lower resistance than the channel formation region 409 and contain a dopant. The drain region 404b is provided in in a superficial portion of the oxide semiconductor film 403 so that the low-resistance region 406b is sandwiched between the channel formation region 409 and the drain region 404b. The high-resistance region 405b is provided to overlap with the drain region 404b and have a higher resistance than the drain region 404b. Furthermore, the oxide semiconductor film 403 includes a high-resistance region 407 and a source region 408. The high-resistance region 407 is provided to overlap with the electrode layer 411 so that the low-resistance region 406a is sandwiched between the channel formation region 409 and the high-resistance region 407. The source region 408 is provided to overlap with the high-resistance region 407 and has a lower resistance than the high-resistance region 407 of the oxide semiconductor film 403. Here, the gate electrode layer 110 is in contact with the source region 408 of the oxide semiconductor film 403, and the drain electrode layer 442b is in contact with the drain region 404b of the oxide semiconductor film 403. Furthermore, a sidewall insulating film may be provided to be in contact with a side surface of the gate electrode layer 401, as in the transistors 462 and 472.

Here, the oxide semiconductor film 403, the low-resistance region 406a, the low-resistance region 406b, the high-resistance region 405a, the drain region 404b, the gate electrode layer 401, the gate insulating film 402, and the drain electrode layer 442b can be formed using the materials and methods described in the above embodiment.

The high-resistance region 407 included in the oxide semiconductor film 403 is formed in a self-aligned manner using the electrode layer 411 as a mask, like the channel formation region 409. Since the gate electrode layer 110 is formed of the same material as the metal-element-containing film 424, the source region 408 is formed in a region where the gate electrode layer 110 is in contact with the oxide semiconductor film 403, as in the case of the source region 404a described in the above embodiment. The source region 408 of the oxide semiconductor film 403 is electrically connected to the gate electrode layer 110; in other words, the gate electrode layer 110 also serves as a source electrode of the transistor 482.

The gate electrode layer 110, the high-resistance region 407, the insulating film 412, and the electrode layer 411 overlap with one another, whereby a capacitor 484 is formed. Here, the oxide semiconductor film 403 is a wide-bandgap semiconductor as described in the above embodiment, and the high-resistance region 407 can serve as a dielectric substance of the capacitor 484 because of its sufficiently high resistance. In other words, the capacitor 484 is a capacitor in which the gate electrode layer 110 serves as one electrode, the high-resistance region 407 and the insulating film 412 serve as a dielectric substance of the capacitor, and the electrode layer 411 serves as the other electrode. With such a structure, the capacitor 484 can have sufficient capacitance.

By forming the capacitor 484 so as to overlap with the oxide semiconductor film 403 of the transistor 482, the area occupied by the semiconductor device can be reduced. When a memory device in which the semiconductor devices in this embodiment are arrayed as memory cells is manufactured, the effect of reduction in area can be obtained in accordance with the number of memory cells. Thus, the memory device can be highly integrated effectively, and the storage capacity per unit area can be increased.

Even when a wide-bandgap oxide semiconductor is used as the oxide semiconductor film 403 and the high-resistance region 407 has a sufficiently high resistance, a metal element is added to form the source region 408 and the drain region 404b, whereby the transistor 462 can have excellent on-state characteristics.

By provision of the low-resistance region 406a and the low-resistance region 406b, the on-state characteristics (e.g., on-state current and field effect mobility) of the transistor 482 can be further improved.

The insulating film 425, the insulating film 426, and the wiring layer 456 are formed over the transistor 482 and the capacitor 484. The materials and methods described in the above embodiments can be referred to for the formation of the insulating films 425 and 426, and the wiring layer 456.

In FIGS. 7A and 7B, the transistor 480 and the transistor 482 are provided to overlap with each other at least partly. The source region or the drain region of the transistor 480 is preferably provided to overlap with part of the oxide semiconductor film 403. In addition, the transistor 482 and the capacitor 484 are preferably provided to overlap with at least part of the transistor 480. With such a planar layout, the area occupied by the semiconductor device can be reduced; thus, higher integration can be achieved.

FIG. 7C illustrates an example of a circuit configuration corresponding to FIGS. 7A and 7B.

In FIG. 7C, a first wiring (1st Line) is electrically connected to a source electrode of the transistor 480. A second wiring (2nd Line) is electrically connected to a drain electrode of the transistor 480. A third wiring (3rd Line) is electrically connected to the other of the source electrode and the drain electrode of the transistor 482, and a fourth wiring (4th Line) is electrically connected to a gate electrode of the transistor 482. A gate electrode of the transistor 480 and one of a source electrode and a drain electrode of the transistor 482 are electrically connected to one electrode of the capacitor 484. A fifth wiring (5th line) is electrically connected to the other electrode of the capacitor 484.

The semiconductor device in FIG. 7C utilizes an advantage that the potential of the gate electrode of the transistor 480 can be held, whereby writing, holding, and reading of data can be performed as described below.

Writing and holding of data are described. First, the potential of the fourth wiring is set to a potential at which the transistor 482 is turned on, so that the transistor 482 is turned on. Thus, the potential of the third wiring is supplied to a node (also referred to as node FG) to which the gate electrode of the transistor 480 and one electrode of the capacitor 484 are connected. In other words, a predetermined charge is supplied to the gate electrode of the transistor 480 (i.e., writing of data). Here, charge for supplying either of two different potential levels (hereinafter referred to as low-level charge and high-level charge) is given. After that, the potential of the fourth wiring is set to a potential at which the transistor 482 is turned off, so that the transistor 482 is turned off. Thus, the charge supplied to the gate electrode of the transistor 480 is held (i.e., holding of data).

The off-state current of the transistor 482 is extremely small; accordingly, the charge in the gate electrode of the transistor 480 is held for a long time.

Next, reading of data is described. When an appropriate potential (reading potential) is applied to the fifth wiring in a state where a predetermined potential (constant potential) is applied to the first line, the potential of the second wiring varies depending on the amount of charge held in the gate electrode of the transistor 480. This is because in general, when the transistor 480 is an n-channel transistor, an apparent threshold voltage $V_{th\_H}$ in the case where a high-level charge is given to the gate electrode of the transistor 480 is lower than an apparent threshold voltage $V_{th\_L}$ in the case where a low-level charge is given to the gate electrode of the transistor 480. Here, the apparent threshold voltage refers to the potential of the fifth wiring, which is needed to turn on the transistor 480. Thus, the potential of the fifth wiring is set to a potential $V_0$ which is between $V_{th\_H}$ and $V_{th\_L}$, whereby charge given to the gate electrode of the transistor 480 can be determined. For example, in the case where a high-level charge is given in writing, when the potential of the fifth wiring is set to $V_0$ ($>V_{th\_H}$), the transistor 480 is turned on. In the case where low-level charge is given in writing, even when the potential of the fifth wiring is set to $V_0$ ($<V_{th\_L}$), the transistor 480 remains in an off state. Therefore, the stored data can be read by the potential of the second wiring.

Note that in the case where memory cells are arrayed, it is necessary to read data only from a predetermined memory cell. In such a case where data of the other memory cells is not read, a potential at which the transistor 480 is turned off, that is, a potential smaller than $V_{th\_H}$ may be given to the fifth wiring regardless of the state of the gate electrode of the transistor 480. Alternatively, a potential at which the transistor 480 is turned on, that is, a potential higher than $V_{th\_L}$ may be given to the fifth wiring regardless of the state of the gate electrode of the transistor 480.

In the semiconductor device described in this embodiment, the transistor having an extremely small off-state current, in which an oxide semiconductor which is a wide-bandgap semiconductor is used for a channel formation region, is used, whereby stored data can be held for an extremely long time. In other words, power consumption can be sufficiently reduced because refresh operation becomes unnecessary or the frequency of refresh operation can be extremely low. Moreover, stored data can be held for a long time even when power is not supplied for a certain time (note that the potential is preferably fixed).

Further, in the semiconductor device described in this embodiment, high voltage is not needed for writing data and there is no problem of deterioration of elements. For example, unlike a conventional nonvolatile memory, it is not necessary to inject and extract electrons into and from a floating gate, and thus, a problem such as deterioration of a gate insulating layer does not occur at all. In other words, the semiconductor device according to one embodiment of the present invention does not have a limit on the number of write cycles, which is a problem in a conventional nonvolatile memory, and reliability thereof is drastically improved. Furthermore, data is written depending on the on state and the off state of the transistor, whereby high-speed operation can be easily achieved.

Since a transistor including a material other than an oxide semiconductor can operate at sufficiently high speed, a semiconductor device can perform operation (e.g., reading data) at sufficiently high speed in combination of a transistor including an oxide semiconductor. Furthermore, with the use of a transistor including a material other than an oxide semiconductor, a variety of circuits (e.g., a logic circuit and a driver circuit) which is required to operate at high speed can be favorably obtained.

As described above, a semiconductor device having a novel feature can be achieved by being provided with both a transistor including a material other than an oxide semiconductor (in a broader sense, a transistor capable of operating at sufficiently high speed) and a transistor including an oxide semiconductor (in a broader sense, a transistor whose off-state current is sufficiently small).

Furthermore, in the semiconductor device in this embodiment, the gate electrode of the transistor in the lower portion, the high-resistance region in the oxide semiconductor film, and an electrode formed from the same layer as the gate electrode layer of the transistor in the upper portion are used to form a capacitor. Therefore, the area occupied by a transistor and a capacitor can be reduced, whereby the degree of integration of a semiconductor device can be enhanced and the storage capacity per unit area can be increased.

The structures and methods described in this embodiment can be combined as appropriate with any of the structures and methods described in the other embodiments.

(Embodiment 4)

In this embodiment, examples of application of the semiconductor device described in any of the above embodiments to portable devices such as cellular phones, smartphones, or electronic books are described with reference to FIG. 8, FIG. 9, FIG. 10, and FIG. 11.

In a portable device such as a cellular phone, a smartphone, or an electronic book, a DRAM or the like is used so as to store image data temporarily. The reason why a DRAM is used is that a flash memory is slow in responding and is not suitable for image processing. On the other hand, a DRAM has the following characteristics when used for temporary storage of image data.

Figure 8:
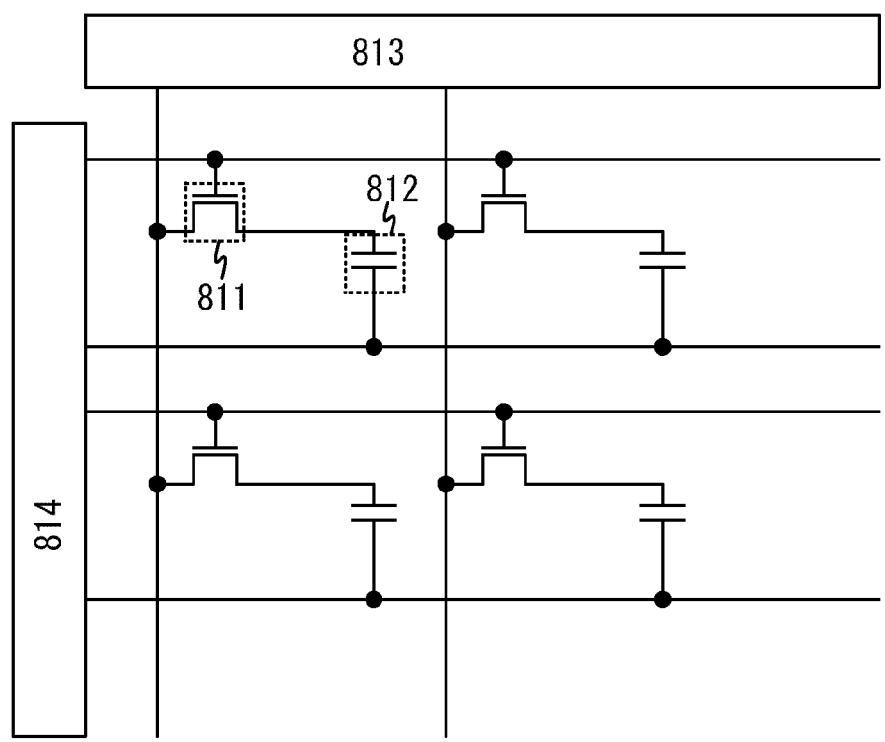
FIG. 8 is a circuit diagram illustrating a semiconductor device according to one embodiment of the present invention.

In a DRAM, as illustrated in FIG. 8, a memory cell includes a transistor 811 and a storage capacitor 812, which are driven with an X decoder 813 and a Y decoder 814. One cell is configured with one transistor and one capacitor and has a small area. The area of a memory cell in a DRAM is generally 10 $F^2$ or less. Note that the DRAM needs to be refreshed periodically and consumes electric power even when a rewriting operation is not performed.

On the other hand, the memory cell of the semiconductor device described in any of the above embodiments does not need to be refreshed frequently. Therefore, the area of a memory cell can be decreased, and power consumption can be reduced.

Figure 9:
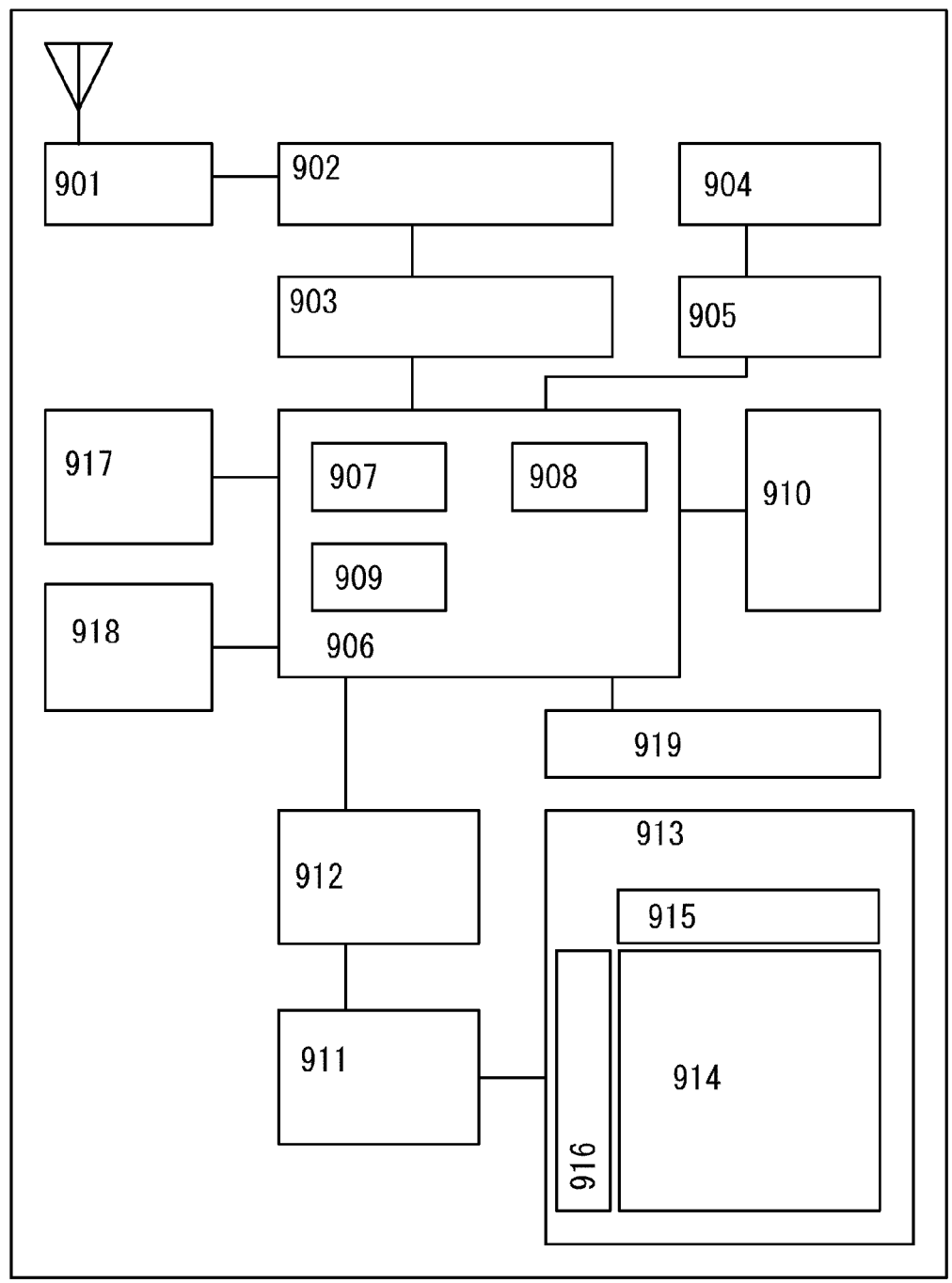
FIG. 9 is a block diagram illustrating a semiconductor device according to one embodiment of the present invention.

Next, FIG. 9 is a block diagram of a portable device. The portable device illustrated in FIG. 9 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a CPU 907, a DSP 908, and an interface (IF) 909. In general, the memory circuit 912 includes an SRAM or a DRAM. By employing the semiconductor device described in any of the above embodiments for that portion, data can be written and read at high speed and can be held for a long time, and power consumption can be sufficiently reduced.

Figure 10:
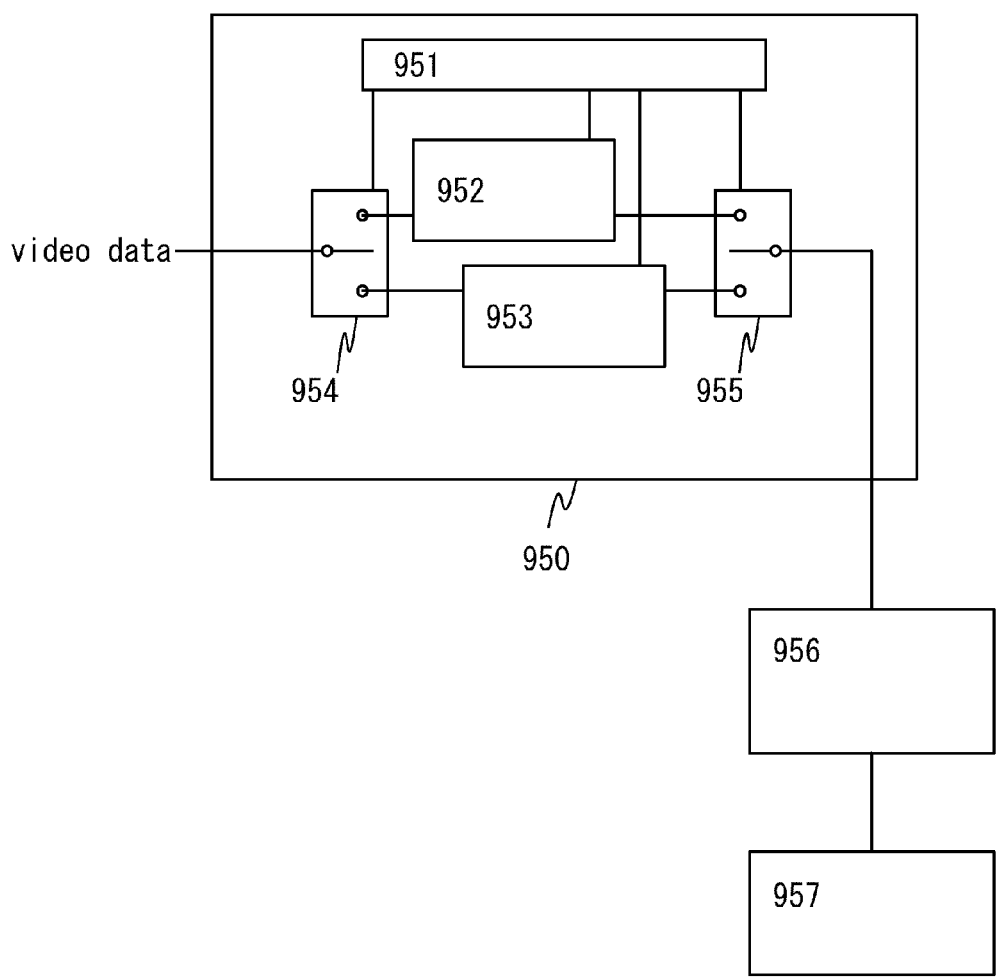
FIG. 10 is a block diagram illustrating a semiconductor device according to one embodiment of the present invention.

FIG. 10 illustrates an example of using the semiconductor device described in any of the above embodiments in a memory circuit 950 for a display. The memory circuit 950 illustrated in FIG. 10 includes a memory 952, a memory 953, a switch 954, a switch 955, and a memory controller 951. The memory circuit 950 is connected to a display controller 956 that reads and controls image data input through a signal line (input image data) and data stored in the memory 952 and the memory 953 (stored image data), and is also connected to a display 957 that displays an image based on a signal input from the display controller 956.

First, image data (input image data A) is produced by an application processor (not illustrated). The input image data A is stored in the memory 952 through the switch 954. Then, the image data stored in the memory 952 (stored image data A) is transmitted to the display 957 through the switch 955 and the display controller 956, and is displayed on the display 957.

When the input image data A remains unchanged, the stored image data A is read from the memory 952 through the switch 955 by the display controller 956 normally at a frequency of approximately 30 Hz to 60 Hz.

Next, for example, when a user performs an operation to rewrite a screen (i.e., when the input image data A is changed), the application processor produces new image data (input image data B). The input image data B is stored in the memory 953 through the switch 954. Also during that time, the stored image data A is regularly read from the memory 952 through the switch 955. After the completion of storing the new image data (the stored image data B) in the memory 953, from the next frame for the display 957, the stored image data B starts to be read, transmitted to the display 957 through the switch 955 and the display controller 956, and displayed on the display 957. This reading operation continues until the next new image data is stored in the memory 952.

By alternately writing and reading image data to and from the memory 952 and the memory 953 as described above, images are displayed on the display 957. Note that the memory 952 and the memory 953 are not limited to separate memories, and a single memory may be divided and used. By employing the semiconductor device described in any of the above embodiments for the memory 952 and the memory 953, data can be written and read at high speed and held for a long time, and power consumption can be sufficiently reduced.

Figure 11:
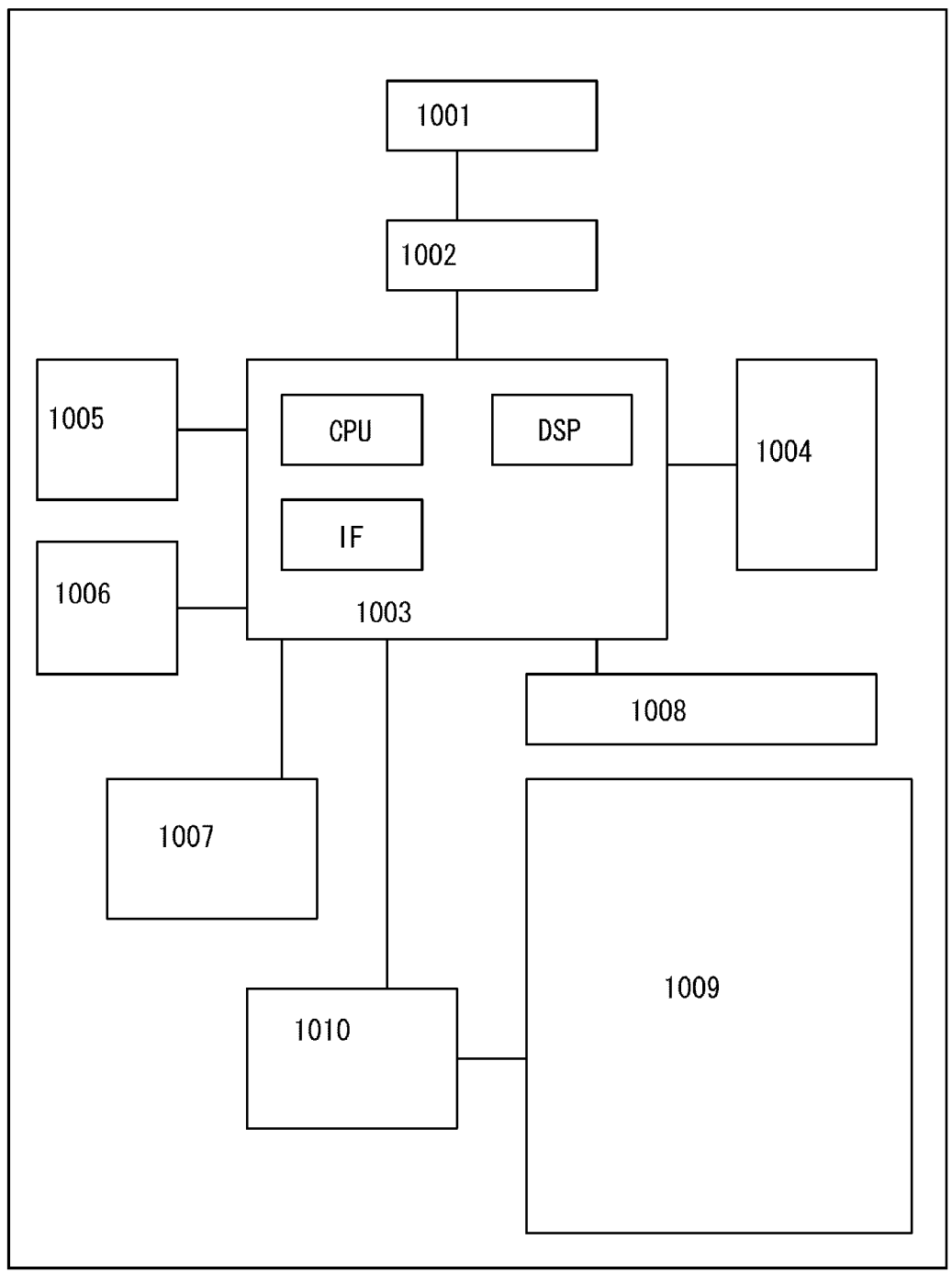
FIG. 11 is a block diagram illustrating a semiconductor device according to one embodiment of the present invention.

FIG. 11 is a block diagram of an electronic book. FIG. 11 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010.

Here, the semiconductor device described in any of the above embodiments can be used for the memory circuit 1007 in FIG. 11. The memory circuit 1007 has a function of temporarily holding the contents of a book. For example, when a user uses a highlight function, the memory circuit 1007 stores and holds data of a portion specified by the user. Note that the highlight function is used to make a difference between a specific portion and the other portions while reading an electronic book, by marking the specific portion, e.g., by changing the display color, underlining, making characters bold, changing the font of characters, or the like. In order to store the data for a long time, the data may be copied to the flash memory 1004. Also in such a case, by employing the semiconductor device described in any of the above embodiments, data can be written and read at high speed and held for a long time, and power consumption can be sufficiently reduced.

As described above, the portable devices described in this embodiment each incorporate the semiconductor device according to any of the above embodiments. Therefore, it is possible to obtain a portable device which is capable of reading data at high speed, holding data for a long time, and reducing power consumption.

The structures and methods described in this embodiment can be combined as appropriate with any of the structures and methods described in the other embodiments.

This application is based on Japanese Patent Application serial no. 2011-161329 filed with Japan Patent Office on Jul. 22, 2011, the entire contents of which are hereby incorporated by reference.

What is claimed is:

1. A semiconductor device comprising:
a transistor; and
a capacitor,
wherein the transistor comprises:
an oxide semiconductor film comprising:
a channel formation region;
a pair of first regions; and
a pair of second regions over the pair of first regions,
a source electrode layer and a drain electrode layer over the pair of second regions;
a gate electrode layer over the oxide semiconductor film; and
a gate insulating film between the oxide semiconductor film and the gate electrode layer,
wherein the capacitor comprises:
a wiring layer;
one of the pair of first regions over the wiring layer;
one of the pair of second regions over the one of the pair of first regions; and
the source electrode layer over the one of the pair of second regions,
wherein a resistance value of the pair of first regions is higher than a resistance value of the pair of second regions, and
wherein the pair of second regions comprises at least one of aluminum, titanium, molybdenum, tungsten, hafnium, tantalum, lanthanum, barium, magnesium, zirconium, and nickel.

2. The semiconductor device according to claim 1,
wherein the oxide semiconductor film further comprises a pair of third regions,
wherein one of the pair of third regions is provided between the channel formation region and one of the pair of second regions, and the other of the pair of third regions is provided between the channel formation region and the other of the pair of second regions, and
wherein the pair of third regions comprises phosphorus or boron.

3. The semiconductor device according to claim 1, further comprising a sidewall insulating film provided to be in contact with a side surface of the gate electrode layer.

4. The semiconductor device according to claim 1,
wherein the oxide semiconductor film comprises indium, zinc, and at least one selected from rare earth elements.

5. The semiconductor device according to claim 1,
wherein the oxide semiconductor film comprises indium, zinc, and at least one selected from zirconium, gadolinium, cerium, and titanium.

6. A semiconductor device comprising:
a transistor; and
a capacitor,
wherein the transistor comprises:
an oxide semiconductor film comprising:
a channel formation region;
a pair of first regions; and
a pair of second regions over the pair of first regions,
a source electrode layer and a drain electrode layer over the pair of second regions;
a gate electrode layer over the oxide semiconductor film; and
a gate insulating film between the oxide semiconductor film and the gate electrode layer,
wherein the capacitor comprises:
a wiring layer;
one of the pair of first regions over the wiring layer;
one of the pair of second regions over the one of the pair of first regions; and
the source electrode layer over the one of the pair of second regions, wherein a resistance value of the pair of first regions is higher than a resistance value of the pair of second regions, wherein the pair of second regions comprises at least one of aluminum, titanium, molybdenum, tungsten, hafnium, tantalum, lanthanum, barium, magnesium, zirconium, and nickel, and wherein off-state current per micrometer of a channel width of the transistor is $1\times10^{-19}$ A/μm or less.

7. The semiconductor device according to claim 6,
wherein the oxide semiconductor film further comprises a pair of third regions,
wherein one of the pair of third regions is provided between the channel formation region and one of the pair of second regions, and the other of the pair of third regions is provided between the channel formation region and the other of the pair of second regions, and
wherein the pair of third regions comprises phosphorus or boron.

8. The semiconductor device according to claim 6, further comprising a sidewall insulating film provided to be in contact with a side surface of the gate electrode layer.

9. The semiconductor device according to claim 6,
wherein the oxide semiconductor film comprises indium, zinc, and at least one selected from rare earth elements.

10. The semiconductor device according to claim 6,
wherein the oxide semiconductor film comprises indium, zinc, and at least one selected from zirconium, gadolinium, cerium, and titanium.

11. A semiconductor device comprising:
a transistor; and
a capacitor,
wherein the transistor comprises:
    an oxide semiconductor film comprising:
        a channel formation region;
        a pair of first regions; and
        a pair of second regions over the pair of first regions,
    a source electrode layer and a drain electrode layer over the pair of second regions;
    a gate electrode layer over the oxide semiconductor film; and
    a gate insulating film between the oxide semiconductor film and the gate electrode layer,
wherein the capacitor comprises:
    a wiring layer embedded in an insulating film;
    one of the pair of first regions over the wiring layer;
    one of the pair of second regions over the one of the pair of first regions; and
    the source electrode layer over the one of the pair of second regions,
wherein a resistance value of the pair of first regions is higher than a resistance value of the pair of second regions,
wherein the pair of second regions comprises at least one of aluminum, titanium, molybdenum, tungsten, hafnium, tantalum, lanthanum, barium, magnesium, zirconium, and nickel, and
wherein a bottom surface of one of the pair of first regions is in contact with the wiring layer and the insulating film.

12. The semiconductor device according to claim 11,
wherein the oxide semiconductor film further comprises a pair of third regions,
wherein one of the pair of third regions is provided between the channel formation region and one of the pair of second regions, and the other of the pair of third regions is provided between the channel formation region and the other of the pair of second regions, and
wherein the pair of third regions comprises phosphorus or boron.

13. The semiconductor device according to claim 11, further comprising a sidewall insulating film provided to be in contact with a side surface of the gate electrode layer.

14. The semiconductor device according to claim 11,
wherein the oxide semiconductor film comprises indium, zinc, and at least one selected from rare earth elements.

15. The semiconductor device according to claim 11,
wherein the oxide semiconductor film comprises indium, zinc, and at least one selected from zirconium, gadolinium, cerium, and titanium.

* * * * *